United States Patent
Nagami et al.

(10) Patent No.: US 9,663,858 B2
(45) Date of Patent: May 30, 2017

(54) PLASMA PROCESSING APPARATUS

(71) Applicants: Tokyo Electron Limited, Tokyo (JP); Daihen Corporation, Osaka-shi, Osaka (JP)

(72) Inventors: Koichi Nagami, Kurokawa-gun (JP); Koji Itadani, Osaka (JP); Tsuyoshi Komoda, Osaka (JP)

(73) Assignees: TOKYO ELECTRON LIMITED, Tokyo (JP); DAIHEN CORPORATION, Osaka-Shi, Osaka (JP)

(*) Notice: Subject to any disclaimer, the term of this patent is extended or adjusted under 35 U.S.C. 154(b) by 147 days.

(21) Appl. No.: 14/509,131

(22) Filed: Oct. 8, 2014

(65) Prior Publication Data
US 2015/0096684 A1 Apr. 9, 2015

(30) Foreign Application Priority Data
Oct. 9, 2013 (JP) .................. 2013-212130

(51) Int. Cl.
*C23C 16/00* (2006.01)
*C23F 1/00* (2006.01)
(Continued)

(52) U.S. Cl.
CPC ........ *C23C 16/52* (2013.01); *H01J 37/32146* (2013.01); *H01J 37/32165* (2013.01); *H01J 37/32174* (2013.01); *H01J 37/32183* (2013.01)

(58) Field of Classification Search
CPC ........... H01J 37/32146; H01J 37/32165; H01J 37/32183; H01J 37/32174; C23C 16/52; C23C 16/505
(Continued)

(56) References Cited

U.S. PATENT DOCUMENTS

2004/0116080 A1* 6/2004 Chen .................. G01R 19/0061
455/115.1
2009/0255800 A1* 10/2009 Koshimizu ....... H01J 37/32165
204/164
(Continued)

FOREIGN PATENT DOCUMENTS

JP 2000-071292 A 3/2000
JP 2012-009544 A 1/2012
JP 2013-033856 A 2/2013

*Primary Examiner* — Rakesh Dhingra
(74) *Attorney, Agent, or Firm* — Pearne & Gordon LLP

(57) ABSTRACT

In a plasma processing apparatus, when pulse-modulating the high frequency power $RF_1$ for plasma generation and the high frequency power $RF_2$ for ion attraction with a first pulse $PS_1$ and a second pulse $PS_2$ having different frequencies, respectively, an impedance sensor 96A in a matching device 40 of a plasma generation system calculates an average value (primary moving average value ma) of an load impedance on a high frequency transmission line 43 for each cycle of the second pulse $PS_2$ having a lower frequency, and outputs a load impedance measurement value based on those average values of the load impedance. Then, a matching controller 94A controls reactances of reactance elements $X_{H1}$ and $X_{H2}$ within a matching circuit 88A such that the load impedance measurement value is equal or approximate to a matching point (50Ω).

9 Claims, 18 Drawing Sheets

(51) Int. Cl.
*H01L 21/306* (2006.01)
*C23C 16/52* (2006.01)
*H01J 37/32* (2006.01)

(58) Field of Classification Search
USPC ............... 156/345.24–345.28; 118/715–733
See application file for complete search history.

(56) References Cited

U.S. PATENT DOCUMENTS

2009/0297404 A1\* 12/2009 Shannon ........... H01J 37/32082
422/108
2012/0052689 A1\* 3/2012 Tokashiki ......... H01J 37/32091
438/714
2013/0214828 A1\* 8/2013 Valcore, Jr. ....... H01J 37/32146
327/141

\* cited by examiner

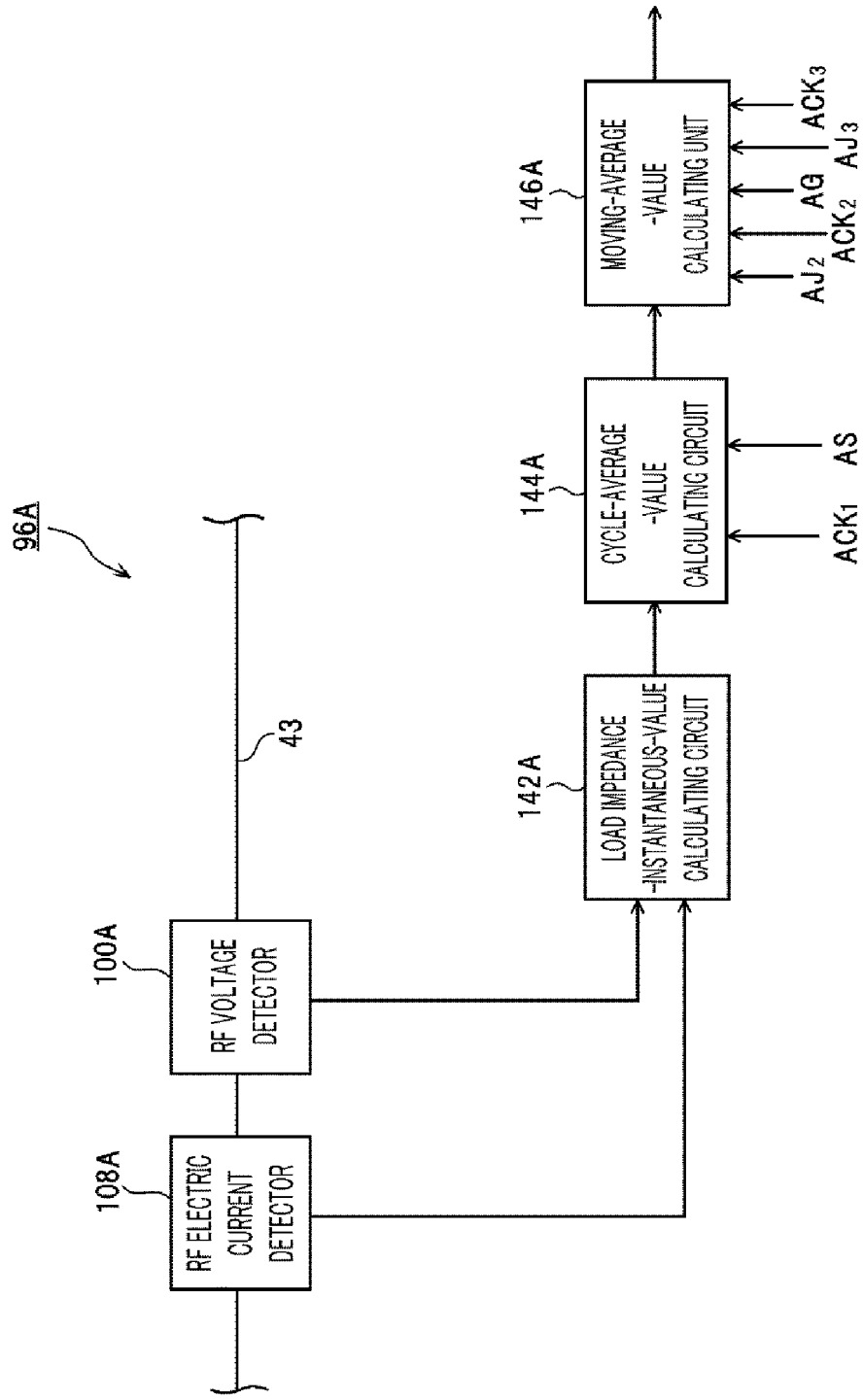

PLASMA PROCESSING APPARATUS

CROSS-REFERENCE TO RELATED APPLICATION

This application claims the benefit of Japanese Patent Application No. 2013-212130 filed on Oct. 9, 2013, the entire disclosures of which are incorporated herein by reference.

TECHNICAL FIELD

The embodiments described herein pertain generally to a technique of performing a plasma process on a processing target object within a processing vessel; and, more particularly, to a power modulation type plasma processing apparatus of pulse-modulating a high frequency power applied to an electrode within or in a vicinity of the processing vessel.

BACKGROUND

Generally, in a plasma processing apparatus, plasma of a processing gas is generated within a decompression processing vessel. Further, a thin film is formed on a processing target object within the processing vessel by a gas phase reaction or a surface reaction of radicals or ions included in the generated plasma, or micro-processing such as etching of a material or a thin film on a surface of the processing target object is performed.

For example, a capacitively coupled plasma processing apparatus includes an upper electrode and a lower electrode arranged in parallel to each other within a processing vessel. A processing target object (e.g., a semiconductor wafer, a glass substrate, etc) is mounted on the lower electrode, and a high frequency power having a frequency (typically, 13.56 MHz or higher) suitable for plasma generation is applied to the upper electrode or the lower electrode. Electrons are accelerated in a high frequency electric field generated between the two facing electrodes by applying the high frequency power, and plasma is generated as a result of ionization by collision between the electrons and a processing gas. A plasma process such as film forming process or etching process is performed under this plasma.

Recently, as a design rule is getting more miniaturized in a manufacturing process of a semiconductor device or the like, higher level of dimensional accuracy is required in, especially, the plasma etching. Further, it is required to increase etching selectivity against a mask or an underlying film and to improve etching uniformity in the entire surface of a substrate. For this reason, pressure and ion energy in a processing region within a chamber tends to be reduced, so that a high frequency power having a high frequency equal to or higher than 40 MHz is used.

However, as the pressure and the ion energy are reduced, an influence of a charging damage, which has been negligible conventionally, can be no more neglected. That is, in a conventional plasma processing apparatus having the high ion energy, no serious problem may occur even when a plasma potential is non-uniform in the entire surface of the substrate. However, if the ion energy is lowered at a lower pressure, the non-uniformity of the plasma potential in the entire surface of the substrate may easily cause the charging damage on a gate oxide film.

In this regard, to solve the above-mentioned problem, a method of pulse-modulating a high frequency power for plasma generation with an on/off (or H level/L level) pulse having a controllable duty ratio (hereinafter, referred to as "first power modulation method") has been considered effective. According to this first power modulation method, a plasma generation state in which plasma of a processing gas is being generated and a plasma non-generation state in which the plasma is not being generated are alternately repeated at a preset cycle during a plasma etching process. Accordingly, as compared to a typical plasma process in which plasma is continuously generated from the beginning of the process to the end thereof, a time period during which plasma is continuously generated may be shortened. As a result, the amount of electric charges introduced into a processing target object from the plasma at one time or the amount of electric charges accumulated on the surface of the processing target object may be reduced, so that the charging damage is suppressed from being generated. Therefore, a stable plasma process can be performed and reliability of the plasma process can be improved.

Further, conventionally, in the plasma processing apparatus, a RF bias method is widely employed. In this RF bias method, a high frequency power having a relatively low frequency (typically, 13.56 MHz or lower) is applied to the lower electrode on which the processing target object is mounted, and ions in plasma are accelerated and attracted to the processing target object by a negative bias voltage or a sheath voltage generated on the lower electrode. In this way, by accelerating the ions in the plasma and bringing them into collision with the surface of the processing target object, a surface reaction, an anisotropic etching or a film modification may be facilitated.

However, when performing the etching process to form via holes or contact holes by using the plasma etching apparatus, a so-called micro-loading effect may occur. That is, an etching rate may differ depending on the hole size (or dense/sparse pattern), so that it is difficult to control an etching depth. Especially, the etching rate tends to be higher at a large area such as a guide ring (GR), whereas the etching rate tends to be lower at a small via into which CF-based radicals are difficult to be introduced.

In this regard, to solve the above-stated problem, a method of pulse-modulating a high frequency power for ion attraction with a first level/second level (or on/off) pulse having a controllable duty ratio (hereinafter, referred to as "second power modulation method") has been considered effective. According to the second power modulation method, a period during which the high frequency power for ion attraction is maintain at a relatively high value having the first level (H level) suitable for etching a preset film on the processing target object and a period during which the high frequency power for ion attraction is maintain at a relatively low value having the second level (L level) suitable for depositing polymer on the preset film on the processing target object are alternately repeated at a certain cycle. Accordingly, at an area having a larger (wider) hole size, a proper polymer layer may be deposited on the preset film at a higher deposition rate, so that the etching may be suppressed. Thus, an undesirable micro-loading effect may be reduced, and it may be possible to perform an etching process with a higher selectivity and a higher etching rate.

Patent Document 1: Japanese Patent Laid-open Publication No. 2000-071292

Patent Document 2: Japanese Patent Laid-open Publication No. 2012-009544

Patent Document 3: Japanese Patent Laid-open Publication No. 2013-033856

Conventionally, in the plasma processing apparatus, the aforementioned first power modulation method and the second power modulation method are used in combination or used concurrently. In such cases, modulation pulses having the same frequency are used in high frequency power supplies for these two respective power modulation methods (for example, Patent Document 1, 2, and 3).

However, the present inventors et. al. has investigated an expected effect of each of the first and second power modulation methods while varying a frequency of the modulation pulse as a parameter, and has found out that a pulse frequency with which the characteristic of the first power modulation method is maximally exerted and a pulse frequency with which the characteristic of the second power modulation method is maximally exerted tend to be greatly different. For example, it has been found out that, in a certain process, a pulse frequency with which the effect of suppressing the charge-up damage by the first power modulation method is maximally exerted is around 90 kHz, whereas a pulse frequency with which the effect of reducing the micro-loading effect by the second power modulation method is maximally exerted is around 10 kHz. Accordingly, when using the first and second power modulation methods at the same time, it may be desirable to use modulation pulses having different frequencies that enable to achieve the maximum characteristics of the two kinds of power modulation methods individually in a certain process.

If, however, the pulse frequencies are different when using the first and second power modulation methods at the same time, matching operations of matching devices on high frequency power supply lines that transfer high frequencies from individual high frequency power supplies to the plasma within the processing vessel may become difficult. Especially, a matching device for a first high frequency power pulse-modulated with a pulse having a higher frequency may be affected by a periodic variation in plasma impedance which is in synchronization with a pulse of a lower frequency (generated by on/off of a second high frequency power). As a result, the matching operation of the matching device may become unstable.

SUMMARY

In view of the foregoing, example embodiments provide a plasma processing apparatus in which, when pulse-modulating two kinds of high frequency powers applied to an electrode within or in the vicinity of a processing vessel with pulse having different frequencies, both matching devices for the two kinds of high frequency powers are allowed to perform stable and accurate matching operations.

In an example embodiment, a plasma processing apparatus generates plasma by high frequency discharge of a processing gas within a decompression processing vessel that accommodates therein a processing target object, which is loaded into and unloaded from the processing vessel, and performs a process on the processing target object within the processing vessel under the plasma. The plasma processing apparatus includes a first high frequency power supply configured to output a first high frequency power; a first high frequency transmission line configured to transmit the first high frequency power outputted from the first high frequency power supply to a first electrode provided within or in the vicinity of the processing vessel; a first matching device, having a first variable reactance element and a first impedance sensor provided on the first high frequency transmission line, configured to control a reactance of the first variable reactance element such that a first load impedance measurement value outputted from the first impedance sensor is equal to or approximate to a first matching point corresponding to an output impedance of the first high frequency power supply; a first high frequency power modulation unit configured to pulse-modulate an output of the first high frequency power supply with a first pulse such that a first period during which the first high frequency power is turned on or has a first level and a second period during which the first high frequency power is turned off or has a second level lower than the first level are alternately repeated at a regular frequency; a second high frequency power supply configured to output a second high frequency power; a second high frequency transmission line configured to transmit the second high frequency power outputted from the second high frequency power supply to the first electrode or a second electrode provided within or in the vicinity of the processing vessel; a second matching device, having a second variable reactance element and a second impedance sensor provided on the second high frequency transmission line, configured to control a reactance of the second variable reactance element such that a second load impedance measurement value outputted from the second impedance sensor is equal to or approximate to a second matching point corresponding to an output impedance of the second high frequency power supply; and a second high frequency power modulation unit configured to pulse-modulate an output of the second high frequency power supply with a second pulse by alternately repeating a third period during which the second high frequency power is turned on or has a third level and a fourth period during which the second high frequency power is turned off or has a fourth level lower than the third level at a regular frequency lower than a frequency of the first pulse. The first impedance sensor calculates an average value of the load impedance by using a single cycle of the second pulse as a basic cycle, and outputs the first load impedance measurement value based on the average value of the load impedance, and the second impedance sensor calculates an average value of the load impedance by using the single cycle of the second pulse as a basic cycle, and outputs the second load impedance measurement value based on the average value of the load impedance.

With the configuration of the apparatus, in the first matching device in which the first high frequency power is pulse-modulated with the first pulse having the higher frequency, a periodic variation of the load impedance (mainly, a periodic variation of a plasma impedance) generated between the first period and the second period of the second pulse having the lower frequency is canceled through the averaging process in which the single cycle of the second pulse within the first impedance sensor is used as a basic cycle. Accordingly, the matching operation of the first matching device can be stabilized.

Meanwhile, even if the plasma impedance pulsates within each cycle (both the first period and the second period) of the first pulse during the on-period of the second pulse, it looks as if the first high frequency power is supplied to the plasma as a continuous wave in the impedance sensor of the second matching device. Accordingly, the second matching device may perform the matching operation stably even if the same averaging process as that of the first matching device is not performed.

In another example embodiment, a plasma processing apparatus generates plasma by high frequency discharge of a processing gas between a first electrode and a second electrode provided to face each other within a decompression processing vessel that accommodates therein a processing target object, which is loaded into and unloaded from the processing vessel, and performs a process on the processing target object held on the first electrode under the plasma. The plasma processing apparatus includes a first high frequency power supply configured to output a first high frequency power having a frequency suitable for plasma generation; a first high frequency transmission line configured to transmit the first high frequency power outputted from the first high frequency power supply to either one of the first electrode and the second electrode; a first matching device, having a first variable reactance element and a first impedance sensor provided on the first high frequency transmission line, configured to control a reactance of the first variable reactance element such that a first load impedance measurement value outputted from the first impedance sensor is equal to or approximate to a first matching point corresponding to an output impedance of the first high frequency power supply; a first high frequency power modulation unit configured to pulse-modulate an output of the first high frequency power supply with a first pulse such that a first period during which the first high frequency power is turned on or has a first level and a second period during which the first high frequency power is turned off or has a second level lower than the first level are alternately repeated at a regular frequency; a second high frequency power supply configured to output a second high frequency power having a frequency suitable for ion attraction into the processing target object held on the first electrode from the plasma; a second high frequency transmission line configured to transmit the second high frequency power outputted from the second high frequency power supply to the first electrode; a second matching device, having a second variable reactance element and a second impedance sensor provided on the second high frequency transmission line, configured to control a reactance of the second variable reactance element such that a second load impedance measurement value outputted from the second impedance sensor is equal to or approximate to a second matching point corresponding to an output impedance of the second high frequency power supply; and a second high frequency power modulation unit configured to pulse-modulate an output of the second high frequency power supply with a second pulse such that a third period during which the second high frequency power is turned on or has a third level and a fourth period during which the first high frequency power is turned off or has a fourth level lower than the third level are alternately repeated at a regular frequency different from a frequency of the first pulse. If the frequency of the first pulse is higher than a frequency of the second pulse, the first impedance sensor calculates an average value of the load impedance by using a single cycle of the second pulse as a basic cycle and outputs the first load impedance measurement value based on the average value of the load impedance, and the second impedance sensor calculates an average value of the load impedance by using the single cycle of the second pulse as a basic cycle and outputs the second load impedance measurement value based on the average value of the load impedance, and if the frequency of the first pulse is lower than the frequency of the second pulse, the first impedance sensor calculates an average value of the load impedance by using a single cycle of the first pulse as a basic cycle and outputs the first load impedance measurement value based on the average value of the load impedance, and the second impedance sensor calculates an average value of the load impedance by using the single cycle of the first pulse as a basic cycle and outputs the second load impedance measurement value based on the average value of the load impedance.

In the plasma processing apparatuses in accordance with the example embodiments, with the above-described configuration and operation, when simultaneously pulse-modulating two kinds of high frequency powers to be supplied to the electrode within or in the vicinity of the processing vessel with the pulses having different frequencies, both matching devices for the high frequency powers are capable of performing the stable and accurate matching operations.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 17 is a block diagram illustrating a configuration of an impedance sensor in a modification example.

DETAILED DESCRIPTION

Figure 1:
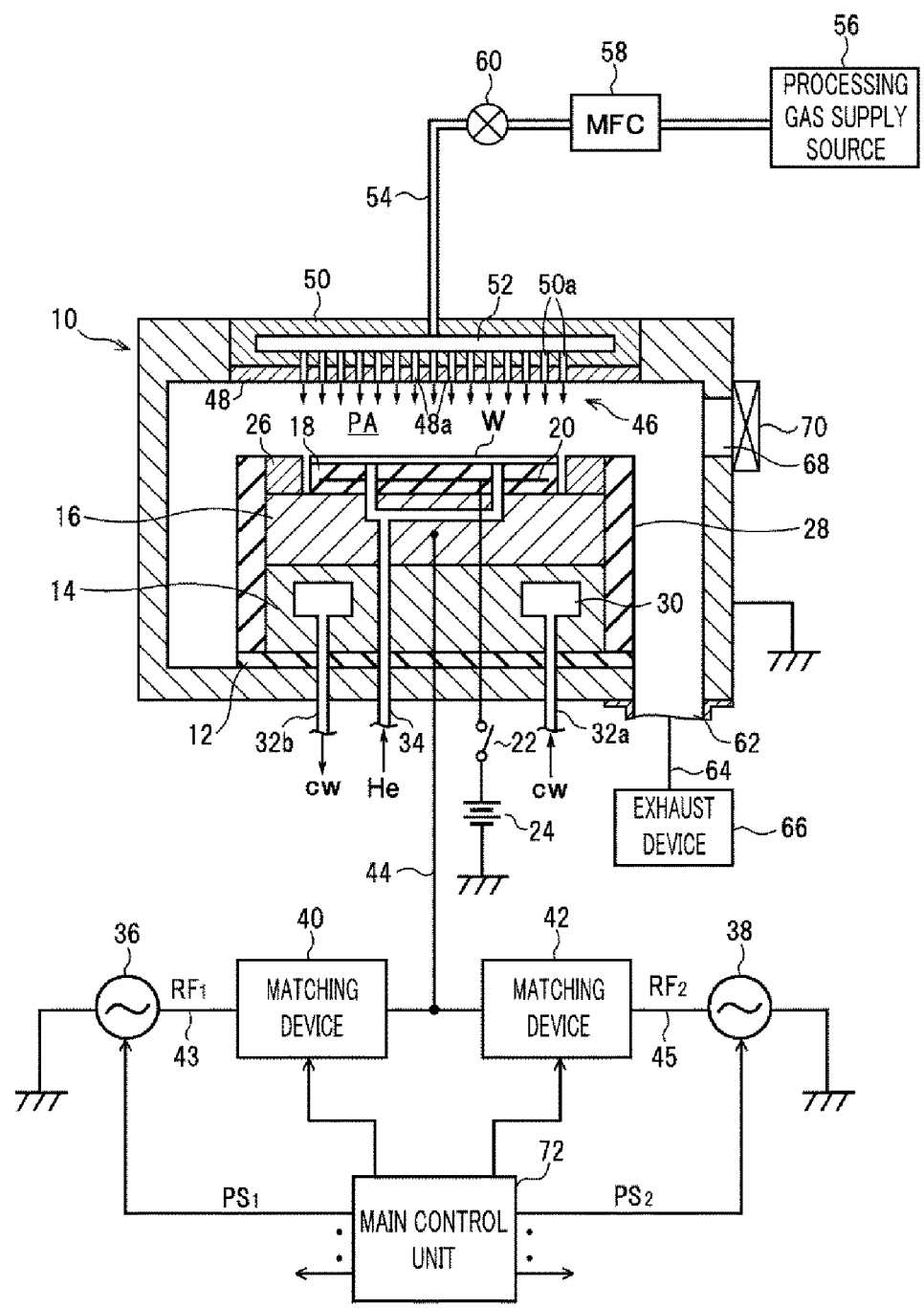
FIG. 1 is a cross sectional view illustrating a configuration of a capacitively coupled plasma processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

<Configuration of Plasma Processing Apparatus>

FIG. 1 shows a configuration of a plasma processing apparatus in accordance with an example embodiment. This plasma processing apparatus is configured as a capacitively coupled (parallel plate type) plasma etching apparatus in which dual high frequency powers are applied to a lower electrode. By way of example, the plasma processing apparatus includes a cylindrical decompression chamber (processing vessel) 10 made of, but not limited to, aluminum having an alumite-treated (anodically oxidized) surface. The chamber 10 is grounded.

A circular columnar susceptor supporting member 14 is provided on an insulating plate 12 such as ceramic on a bottom of the chamber 10, and a susceptor 16 made of, but not limited to, aluminum is provided on the susceptor supporting member 14. The susceptor 16 serves as a lower electrode, and a processing target object, e.g., a semiconductor wafer W is mounted on the susceptor 16.

An electrostatic chuck 18 configured to hold the semiconductor wafer W is provided on a top surface of the susceptor 16. The electrostatic chuck 18 includes a pair of insulating layers or insulating sheets; and an electrode 20 embedded therebetween. The electrode 20 is made of a conductive film and is electrically connected with a DC power supply 24 via a switch 22. The semiconductor wafer W can be held on the electrostatic chuck 18 by an electrostatic adsorptive force generated by a DC voltage applied from the DC power supply 24. In order to improve etching uniformity, a focus ring 26 made of, but not limited to, silicon is provided on the top surface of the susceptor 16 to surround the electrostatic chuck 18. A cylindrical inner wall member 28 made of, but not limited to, quartz is attached to side surfaces of the susceptor 16 and the susceptor supporting member 14.

A coolant path 30 extended in, e.g., a circumferential direction is provided within the susceptor supporting member 14. A coolant of a preset temperature, e.g., cooling water cw from an external chiller unit (not shown) is supplied into and circulated through the coolant path 30 via pipelines 32a and 32b. A processing temperature of the semiconductor wafer W on the susceptor 16 can be controlled by adjusting the temperature of the coolant. Further, a heat transfer gas, e.g., a He gas from a heat transfer gas supplying device (not shown) is supplied into a gap between a top surface of the electrostatic chuck 18 and a rear surface of the semiconductor wafer W through a gas supply line 34.

The susceptor 16 is electrically connected with high frequency power supplies 36 and 38 via matching devices 40 and 42, respectively, and a common power supply conductor (for example, a power supply rod) 44. One high frequency power supply 36 outputs a high frequency power $RF_1$ having a frequency $f_{RF1}$ (for example, 100 MHz) suitable for plasma generation. Meanwhile, the other high frequency power supply 38 outputs a high frequency power $RF_2$ having a frequency $f_{RF2}$ (for example, 13.56 MHz) suitable for ion attraction to the semiconductor wafer W on the susceptor 16 from the plasma.

As such, the matching device 40 and the power supply rod 44 constitute a part of a high frequency transmission line (high frequency transmission path) 43 configured to transmit the high frequency power $RF_1$ for plasma generation from the high frequency power supply 36 to the susceptor 16. Meanwhile, the matching device 42 and the power supply rod 44 constitute a part of a high frequency transmission line (high frequency transmission path) 45 configured to transmit the high frequency power $RF_2$ for ion attraction from the high frequency power supply 38 to the susceptor 16.

An upper electrode 46 having a ground potential is provided at a ceiling of the chamber 10, facing the susceptor 16 in parallel. The upper electrode 46 includes an electrode plate 48 which has a multiple number of gas discharge holes 48a and is made of, e.g., a silicon-containing material such as Si or SiC; and an electrode supporting body 50 which detachably supports the electrode plate 48 and is made of a conductive material such as aluminum having an alumite-treated surface. A plasma generation space or a processing space PA is formed between the upper electrode 46 and the susceptor 16.

The electrode supporting body 50 has a gas buffer room 52 formed therein. The electrode supporting body 50 also has, in its bottom surface, a multiple number of gas holes 50a extended from the gas buffer room 52, and the gas holes 50a communicate with the gas discharge holes 48a of the electrode plate 48, respectively. The gas buffer room 52 is connected to a processing gas supply source 56 via a gas supply line 54. The processing gas supply source 56 is provided with a mass flow controller (MFC) 58 and an opening/closing valve 60. If a certain processing gas (etching gas) is introduced into the gas buffer room 52 from the processing gas supply source 56, the processing gas is then discharged in a shower shape from the gas discharge holes 48a of the electrode plate 48 into the processing space PA toward the semiconductor wafer W on the susceptor 16. In this configuration, the upper electrode 46 also serves as a shower head that supplies the processing gas into the processing space PA.

Further, a passageway (not shown) in which a coolant, e.g., cooling water flows may be provided within the electrode supporting body 50. The entire upper electrode 46, especially, the electrode plate 48 is controlled to have a preset temperature through the coolant by an external chiller unit. Further, in order to stabilize the temperature control over the upper electrode 46, a heater (not shown) including a resistance heating device may be provided within or on a top surface of the electrode supporting body 50.

An annular space formed between a sidewall of the chamber 10, and the susceptor 16 and the susceptor supporting member 14 serves as a gas exhaust space, and a gas exhaust opening 62 of the chamber 10 is formed at a bottom of this gas exhaust space. The gas exhaust opening 62 is connected to a gas exhaust device 66 via a gas exhaust line 64. The gas exhaust device 66 includes a vacuum pump such as a turbo molecular pump and is configured to depressurize the inside of the chamber 10, particularly, the processing space PA to a required vacuum level. Further, a gate valve 70 configured to open and close a loading/unloading opening 68 for the semiconductor wafer W is provided at the sidewall of the chamber 10.

A main control unit 72 includes one or more microcomputers and is configured to control an overall operation (sequence) of the apparatus and individual operations of respective components within the apparatus, particularly, the high frequency power supplies 36 and 38, the matching devices 40 and 42, the MFC 58, the opening/closing valve 60, the gas exhaust device 66, etc., according to software (program) and recipes stored in an external memory or an internal memory.

Further, the main control unit 72 is connected to a man-machine interface manipulation panel (not shown) including an input device such as a keyboard and a display device such as a liquid crystal display and, also, connected to an external storage device (not shown) that stores various types of data such as various programs or recipes, setting values, etc. In the present example embodiment, the main control unit 72 is configured as a single control unit. However, it may be also possible to adopt a configuration in which multiple control units divide up the functions of the main control unit 72 individually or hierarchically.

A basic operation of single-sheet typed dry etching in the capacitively coupled plasma etching apparatus configured as described above is performed as follows. First, the gate valve 70 is opened, and a semiconductor wafer W to be processed is loaded into the chamber 10 and mounted on the electrostatic chuck 18. Then, a processing gas, i.e., an etching gas (generally, a gaseous mixture) is introduced into the chamber 10 from the processing gas supply source 56 at a preset flow rate and a preset flow rate ratio, and the inside of the chamber 10 is evacuated to be a set vacuum pressure by the gas exhaust device 66. Further, the high frequency power $RF_1$ (100 MHz) for plasma generation and the high frequency power $RF_2$ (13.56 MHz) for ion attraction from the high frequency power supplies 36 and 38 are overlapped at preset powers, respectively, to be applied to the susceptor 16. Further, a DC voltage from the DC power supply 24 is applied to the electrode 20 of the electrostatic chuck 18, so that the semiconductor wafer W is held on the electrostatic chuck 18. The etching gas discharged from the upper electrode 46 serving as the shower head is electrically discharged under a high frequency electric field between the two electrodes 46 and 16, so that plasma is generated in the processing space PA. An etching target film on a main surface of the semiconductor wafer W is etched by radicals or ions included in the plasma.

In this capacitively coupled plasma etching apparatus, for example, to solve the above-described charging damage, a first power modulation method of pulse-modulating the high frequency power $RF_1$ for plasma generation outputted from the high frequency power supply 36 with a first pulse $PS_1$ having a regular frequency $f_{s1}$ selected within a range of, for example, 1 kHz to 100 kHz and a variable duty ratio $D_{S1}$ can be used for the etching process. Further, to solve the above-described micro-loading effect, a second power modulation method of pulse-modulating the high frequency power $RF_2$ for ion attraction outputted from the high frequency power supply 38 with a second pulse $PS_2$ having a regular frequency $f_{S2}$ selected within a range of, for example, 100 Hz to 50 kHz and a variable duty ratio $D_{S2}$ can also be used for the same or another etching process.

Figure 2A:
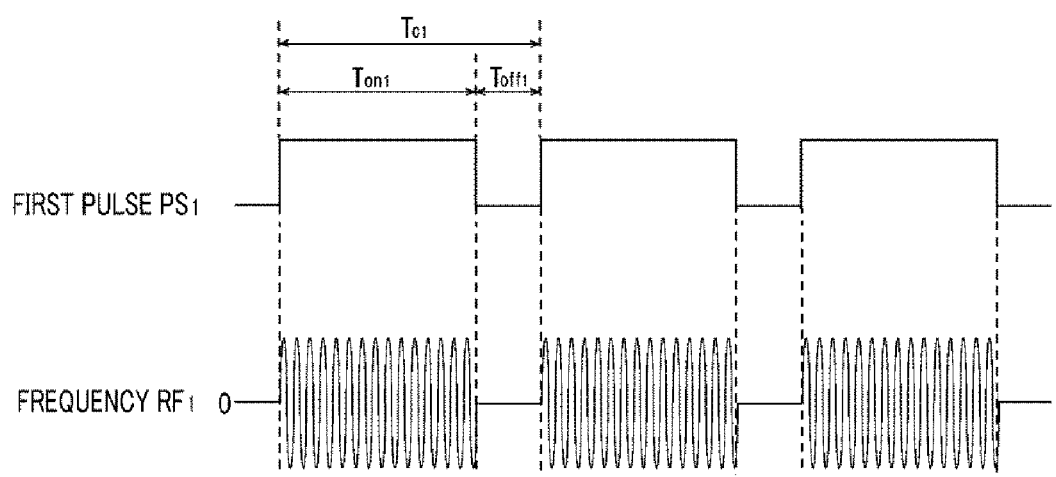
FIG. 2A is a waveform diagram of a high frequency power for plasma generation which is modulated through a first power modulation method in the plasma processing apparatus.

When using the first power modulation method in the aforementioned plasma process of dry etching, the main control unit 72 sends an independent control signal indicating the duty ratio $D_{S1}$ and the frequency $f_{S1}$ of the first pulse $PS_1$ to the high frequency power supply 36. The high frequency power supply 36 turns on and off the high frequency power $RF_1$ for plasma generation in synchronization with the first pulse $PS_1$ as shown in FIG. 2A. Herein, assuming that a cycle, an on-period (first or third period) and an off-period (second or fourth period) of the first pulse $PS_1$ are set to $T_{C1}$, $T_{on1}$, and $T_{off1}$, respectively, relational expressions of $T_{C1}=1/f_{S1}$, $T_{C1}=T_{on1}+T_{off1}$, and $D_{S1}=T_{on1}/(T_{on1}+T_{off1})$ are established.

Figure 2B:
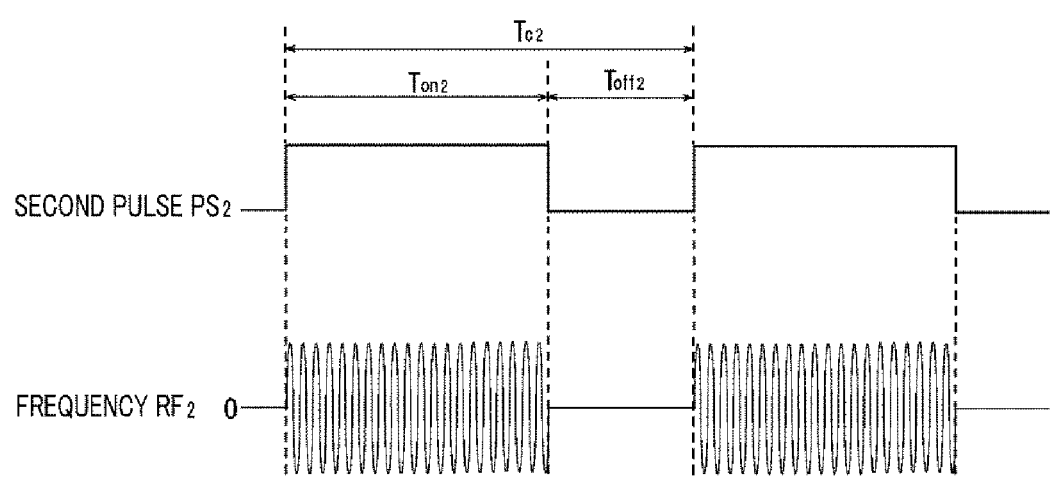
FIG. 2B is a waveform diagram of a high frequency power for ion attraction which is modulated through a second power modulation method in the plasma processing apparatus.

Meanwhile, when using the second power modulation method in the aforementioned plasma process of dry etching, the main control unit 72 sends an independent control signal indicating the duty ratio $D_{S2}$ and the frequency $f_{S2}$ of the second pulse $PS_2$ to the high frequency power supply 38. The high frequency power supply 38 turns on and off the high frequency power $RF_2$ for ion attraction in synchronization with the second pulse $PS_2$ as shown in FIG. 2B. Here, assuming that a cycle, an on-period (first or third period) and an off-period (second or fourth period) of the second pulse $PS_2$ are set to $T_{C2}$, $T_{on2}$, and $T_{off2}$, respectively, relational expressions of $T_{C2}=1/f_{S2}$, $T_{C2}=T_{on2}+T_{off2}$, and $D_{S2}=T_{on2}/(T_{on2}+T_{off2})$ are established.

<Configuration of High Frequency Power Supply and Matching Device of Plasma Generation System>

Figure 3:
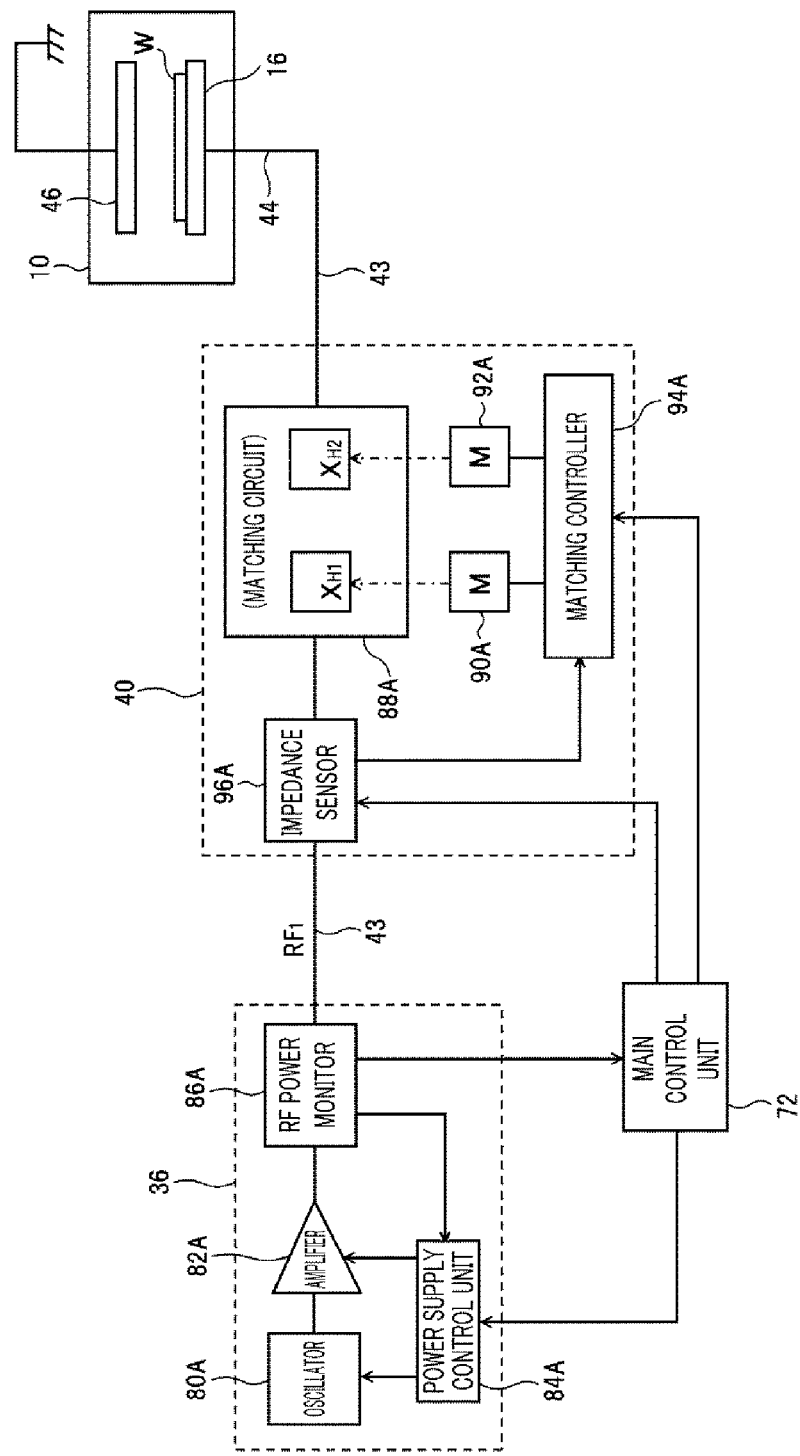
FIG. 3 is a block diagram illustrating a configuration of a matching device and a high frequency power supply for plasma generation.

FIG. 3 illustrates a configuration of the high frequency power supply 36 and a matching device 40 of the plasma generation system.

The high frequency power supply 36 includes an oscillator 80A configured to generate a sine wave of a frequency (for example, 100 MHz) suitable for plasma generation; a power amplifier 82A configured to amplify a power of the sine wave outputted from the oscillator 80A with a controllable gain or amplification factor; and a power supply control unit 84A configured to directly control the oscillator 80A and the power amplifier 82A in response to a control signal from the main control unit 72. The main control unit 72 sends, to the power supply control unit 84A, not only the modulation control pulse signal $PS_1$ but also control signals regarding typical power on/off or power interlock relation and data such as power set values. The main control unit 72 and the power supply control unit 84A constitute a power modulation unit for the high frequency power $RF_1$.

The high frequency power supply 36 also includes a RF power monitor 86A. The RF power monitor 86A includes a directional coupler, a progressive wave power monitoring unit, and a reflection wave power monitoring unit (which are not illustrated). Herein, the directional coupler extracts signals corresponding to a RF power (progressive wave) propagating on the high frequency transmission line 43 in a forward direction and a RF power (reflection wave) propagating on the high frequency transmission line 43 in a backward direction. The progressive wave power monitoring unit is configured to output a signal indicating a power of a fundamental frequency progressive wave (100 MHz) included in the progressive wave propagating on the high frequency transmission line 43 based on a progressive wave power detection signal extracted by the directional coupler. This signal, i.e., a fundamental frequency progressive wave power measurement value, is sent to the power supply control unit 84A within the high frequency power supply 36 for power feedback control, and also sent to the main control unit 72 for monitor display. The reflection wave power monitoring unit is configured to measure a power of a fundamental frequency reflection wave (100 MHz) included in the reflection wave returning back to the high frequency power supply 36 from plasma within the chamber 10, and also configured to measure a total power of all reflection wave spectra included in the reflection wave returning back to the high frequency power supply 36 from plasma within the chamber 10. A fundamental frequency reflection wave power measurement value outputted by the reflection wave power monitoring unit is sent to the main control unit 72 for monitor display, and a total reflection wave power measurement value is sent to the power supply control unit 84A within the high frequency power supply 36 as a monitor value for protecting the power amplifier.

The matching device 40 includes a matching circuit 88A including multiple, for example, two controllable reactance elements (for example, variable capacitors or variable inductors) $X_{H1}$ and $X_{H2}$ connected to the high frequency transmission line 43; a matching controller 94A configured to control reactances of the reactance elements $X_{H1}$ and $X_{H2}$ via actuators such as motors (M) 90A and 92A; and an impedance sensor 96A configured to measure load impedance including impedance of the matching circuit 88A on the high frequency transmission line 43.

Figure 4:
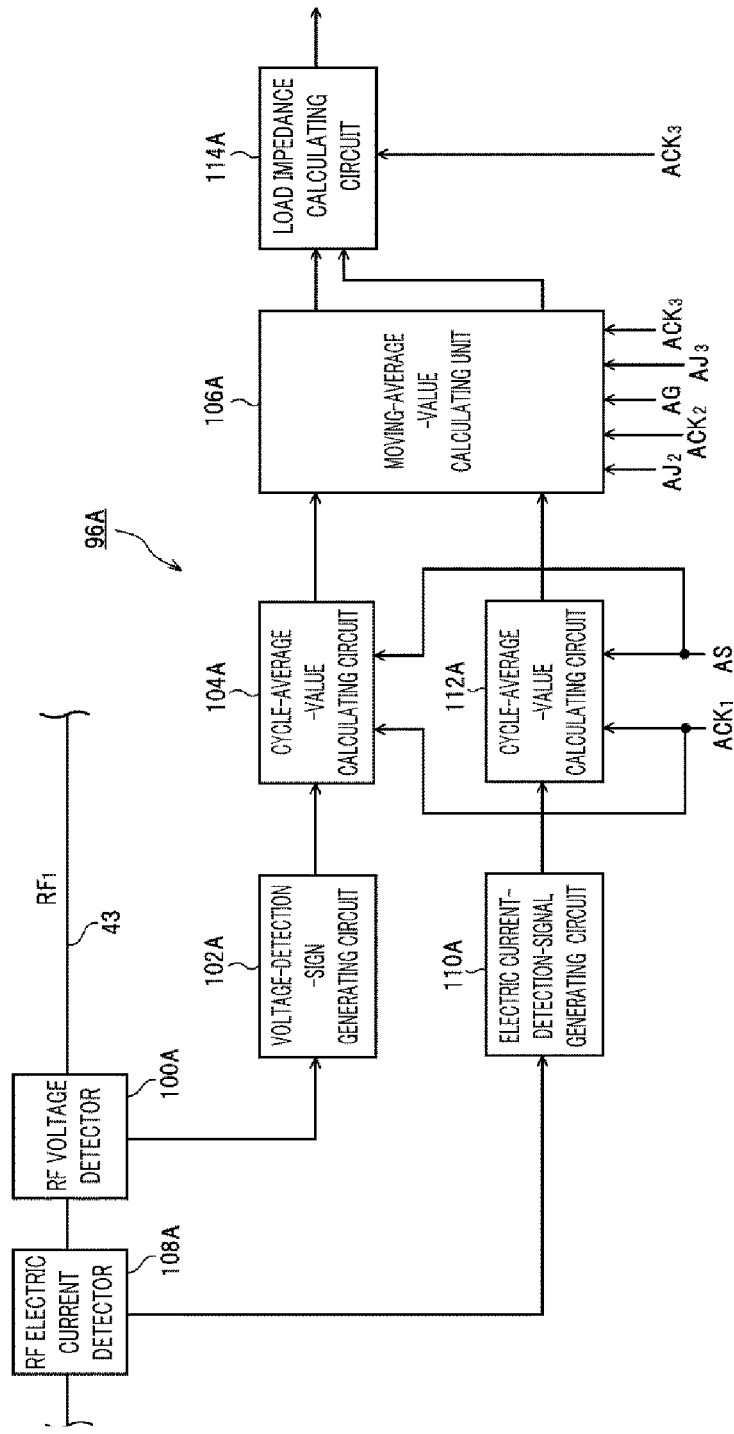
FIG. 4 is a block diagram illustrating a configuration of an impedance sensor provided in the matching device of FIG. 3.

FIG. 4 illustrates an internal configuration of the impedance sensor 96A. This impedance sensor 96A includes a RF voltage detector 100A; a voltage-detection-signal generating circuit 102A; a cycle-average-value calculating circuit 104A and a moving-average-value calculating unit 106A of a voltage sensor system. Further, the impedance sensor 96A includes a RF electric current detector 108A; an electric current-detection-signal generating circuit 110A; a cycle-average-value calculating circuit 112A and the moving-average-value calculating unit 106A; and a load impedance calculating circuit 114A of an electric current sensor system.

The RF voltage detector 100A of the voltage sensor system is configured to detect a voltage of the high frequency power $RF_1$ on the high frequency transmission line 43. The voltage-detection-signal generating circuit 102A includes, for example, a superheterodyne filter circuit, and is configured to generate a voltage detection signal corresponding to the high frequency power $RF_1$ through the analogue filtering of the high frequency voltage detection signal outputted from the RF voltage detector 100A.

The cycle-average-value calculating circuit 104A is operated in synchronization with the power modulation of the first power modulation method, and configured to sample the voltage detection signals obtained from the voltage-detection-signal generating circuit 102A with a preset frequency during a preset monitoring time $T_H$ set in a single cycle of the first pulse $PS_1$ and calculate an average value of these signals for the single cycle. In this configuration example, the analogue voltage detection signals from the voltage-detection-signal generating circuit 102A are converted into digital signals by the cycle-average-value calculating circuit 104A. A clock $ACK_1$ for sampling and a $RF_1$ monitor signal AS for indicating the monitoring time $T_H$ of the high frequency power $RF_1$ are sent to the cycle-average-value calculating circuit 104A from the main control unit 72 (FIG. 1). The cycle-average-value calculating circuit 104A is required to process large quantities of signals at a high speed in synchronization with the sampling clock $ACK_1$ of several tens of MHz or more, and, thus, a FPGA (field programmable gate array) can be used appropriately.

The RF electric current detector 108A of the electric current sensor system is configured to detect an electric current of the high frequency power $RF_1$ on the high frequency transmission line 43. The electric current-detection-signal generating circuit 110A has the same configuration and the same function as the above-described voltage-detection-signal generating circuit 102A, and is configured to generate electric current detection signals for electric currents of the high frequency power $RF_1$. The cycle-average-value calculating circuit 112A has the same configuration and the same function as the above-described cycle-average-value calculating circuit 104A of the voltage sensor system, and is configured to sample the electric current detection signals obtained from the electric current-detection-signal generating circuit 110A with a preset frequency during a preset monitoring time $T_H$ set in a single cycle of the first pulse $PS_1$ and calculate an average value of these signals for the single cycle.

Appropriately, the moving-average-value calculating unit 106A is composed of a CPU. If the first and the second pulse modulation method are used simultaneously in a certain etching process, the mode of calculating the moving-average-value is switched depending on a magnitude relationship of the frequencies $f_{S1}$ and $f_{S2}$ of the first and second pulses $PS_1$ and $PS_2$, respectively.

Figure 5:
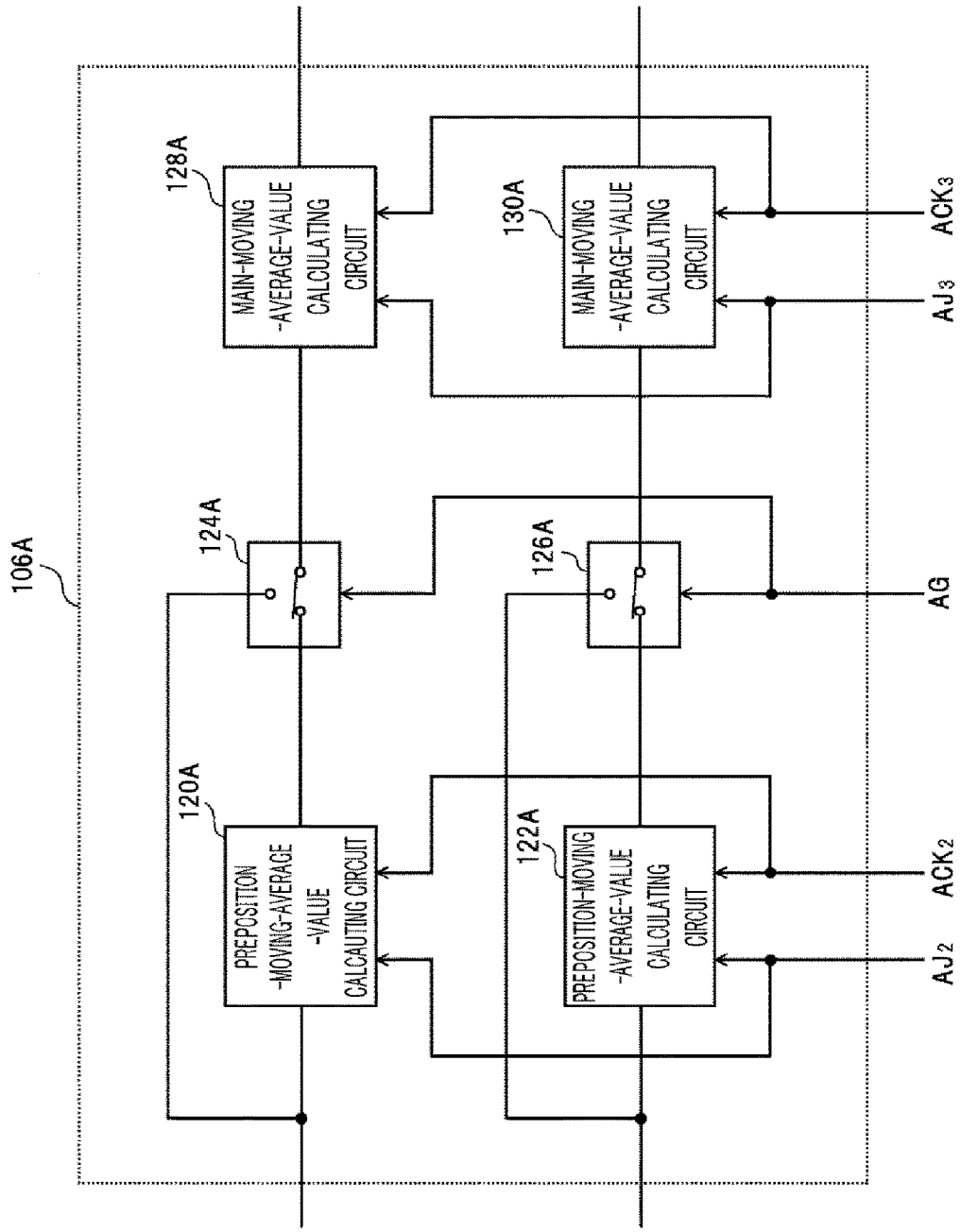
FIG. 5 is a block diagram illustrating a configuration example of a moving-average-value calculating unit provided in the impedance sensor of FIG. 4.

FIG. 5 illustrates a configuration example of the moving-average-value calculating unit 106A. In both of the voltage sensor system and the electric current sensor system, switching circuits 124A and 126A, main-moving-average-value-calculating circuits 128A and 130A, and preposition-moving-average-value-calculating circuits 120A and 122A, which have the same configuration, respectively, are provided.

Here, the preposition-moving-average-value calculating circuits 120A and 122A are operated if the frequency $f_{S1}$ of the first pulse $PS_1$ is higher than the frequency $f_{S2}$ of the second pulse $PS_2$ when the two high frequency powers $RF_1$ and $RF_2$ are simultaneously pulse-modulated with the first and second pulses $PS_1$ and $PS_2$, respectively. That is, the preposition-moving-average-value calculating circuits 120A and 122A are provided to allow the matching device 40 for the high frequency power $RF_1$, which is pulse-modulated with the first pulse $PS_1$ having the higher frequency, to cancel periodic variations in a plasma impedance which varies in synchronization with the second pulse $PS_2$ having the lower frequency (generated by on/off of the high frequency power $RF_2$).

Meanwhile, the main-moving-average-value calculating circuits 128A and 130A are always operated when the high frequency power $RF_1$ is pulse-modulated with the first pulse $PS_1$. That is, the main-moving-average-value calculating circuits 128A and 130A are provided to interface an operating speed (higher speed) of the cycle-average-value calculating circuits 104A and 112A configured to calculate the average value of impedance measurements for each cycle of the first pulse $PS_1$ and an operating speed (lower speed) for control the reactance elements $X_{H1}$ and $X_{H2}$ within the matching device 40.

To be more specific, if the frequency $f_{S1}$ of the first pulse $PS_1$ is higher than the frequency $f_{S2}$ of the second pulse $PS_2$ ($f_{S1} > f_{S2}$) when the two high frequency powers $RF_1$ and $RF_2$ are pulse-modulated at the same time, the moving-average-value calculating unit 106A is switched to a first moving-average-value calculating mode, and the preposition-moving-average-value calculating circuits 120A and 122A are operated in an active state. In this case, a control signal $AJ_2$ for indicating a moving range corresponding to the single cycle of the second pulse $PS_2$ having the lower frequency and a sampling clock $ACK_2$ for defining a moving pitch corresponding to an $AN_1$ cycle ($AN_1$ denotes an integer equal to or larger than 2 and equal to or smaller than $f_{S1}/f_{S2}$) of the first pulse $PS_1$ having the higher frequency are sent from the main control unit 72 (FIG. 1) to the preposition-moving-average-value calculating circuits 120A and 122A. Further, the switching circuits 124A and 126A are switched according to a switching control signal AG from the main control unit 72 such that the outputs of the preposition-moving-average-value calculating circuits 120A and 122A are sent to the main-moving-average-value calculating circuits 128A and 130A at the rear end thereof, respectively. A control signal $AJ_3$ for indicating a certain moving range corresponding to an $AN_2$ cycle ($AN_2$ denotes an integer equal to or larger than 2) of the second pulse $PS_2$ having the lower frequency and a sampling clock $ACK_3$ for defining a certain moving pitch corresponding to an $AN_3$ cycle ($AN_3$ denotes an integer equal to or larger than 2 and equal to or smaller $AN_2$) of the second pulse $PS_2$ are sent from the main control unit 72 to the main-moving-average-value calculating circuits 128A and 130A.

On the contrary, if the frequency $f_{S1}$ of the first pulse $PS_1$ is lower than the frequency $f_{S2}$ of the second pulse $PS_2$ ($f_{S1} < f_{S2}$), the moving-average-value calculating unit 106A is switched to a second moving-average-value calculating mode, and the preposition-moving-average-value calculating circuits 120A and 122A are not operated. According to the switching control signal AG, the switching circuits 124A and 126A are switched to send the outputs of the cycle-average-value calculating circuits 104A and 112A to the main-moving-average-value calculating circuits 128A and 130A at the rear end thereof without sending the outputs to the preposition-moving-average-value calculating circuits 120A and 122A. A control signal $AJ_3$ for indicating a certain moving range corresponding to the $AN_2$ cycle of the first pulse $PS_1$ having the lower frequency and the sampling clock $ACK_3$ for defining a certain moving pitch corresponding to the $AN_3$ cycle of the first pulse $PS_1$ are sent from the main control unit 72 to the main-moving-average-value calculating circuits 128A and 130A.

Further, if either one of the two high frequency powers $RF_1$ and $RF_2$ is pulse-modulated while the other is set as a continuous wave, the preposition-moving-average-value calculating circuits 120A and 122A are not operated, and only the main-moving-average-value calculating circuits 128A and 130A are operated, as in the second moving-average-value calculating mode.

In FIG. 4, the load impedance calculating circuit 114A is configured to calculate a measurement value of the load impedance on the high frequency transmission line 43 with respect to the high frequency power supply 36 based on the moving average value of the voltage detection signals and the moving average value of the electric current detection signals received from the moving-average-value calculating unit 106A. The measurement value of the load impedance outputted from the load impedance calculating circuit 114A is updated in synchronization with the clock $ACK_3$. Typically, the measurement value of the load impedance outputted from the load impedance calculating circuit 114A includes an absolute value and a phase measurement value of the load impedance. Here, the CPU that constitutes the moving-average-value calculating unit 106A may have the function of the load impedance calculating circuit 114A as well.

Further, the load impedance on the high frequency transmission line 43 is a combination of an impedance of the chamber 10 (mainly, plasma impedance) with respect to the susceptor 16, an impedance of the matching circuit 88A, and so forth.

In FIG. 3, the matching controller 94A within the matching device 40 is configured to respond to the load impedance measurement value outputted from the impedance sensor 96A, and control the motors 90A and 92A to set the reactances of the reactance elements $X_{H1}$ and $X_{H2}$ within the matching circuit 88A such that a phase of the load impedance measurement value is zero (0) and an absolute value thereof is 50Ω.

The load impedance measurement value sent from the impedance sensor 96A to the matching controller 94A is updated in synchronization with the clock $ACK_3$ as described above. The matching controller 94A does not stop the matching operation, i.e., the control of the reactances of the reactance elements $X_{H1}$ and $X_{H2}$ during the update, and continuously controls the motors 90A and 92A such that the load impedance measurement value immediately before the update can be made equal or approximate to a matching point.

<Configuration of High Frequency Power and Matching Device of Ion Attraction System>

Figure 6:
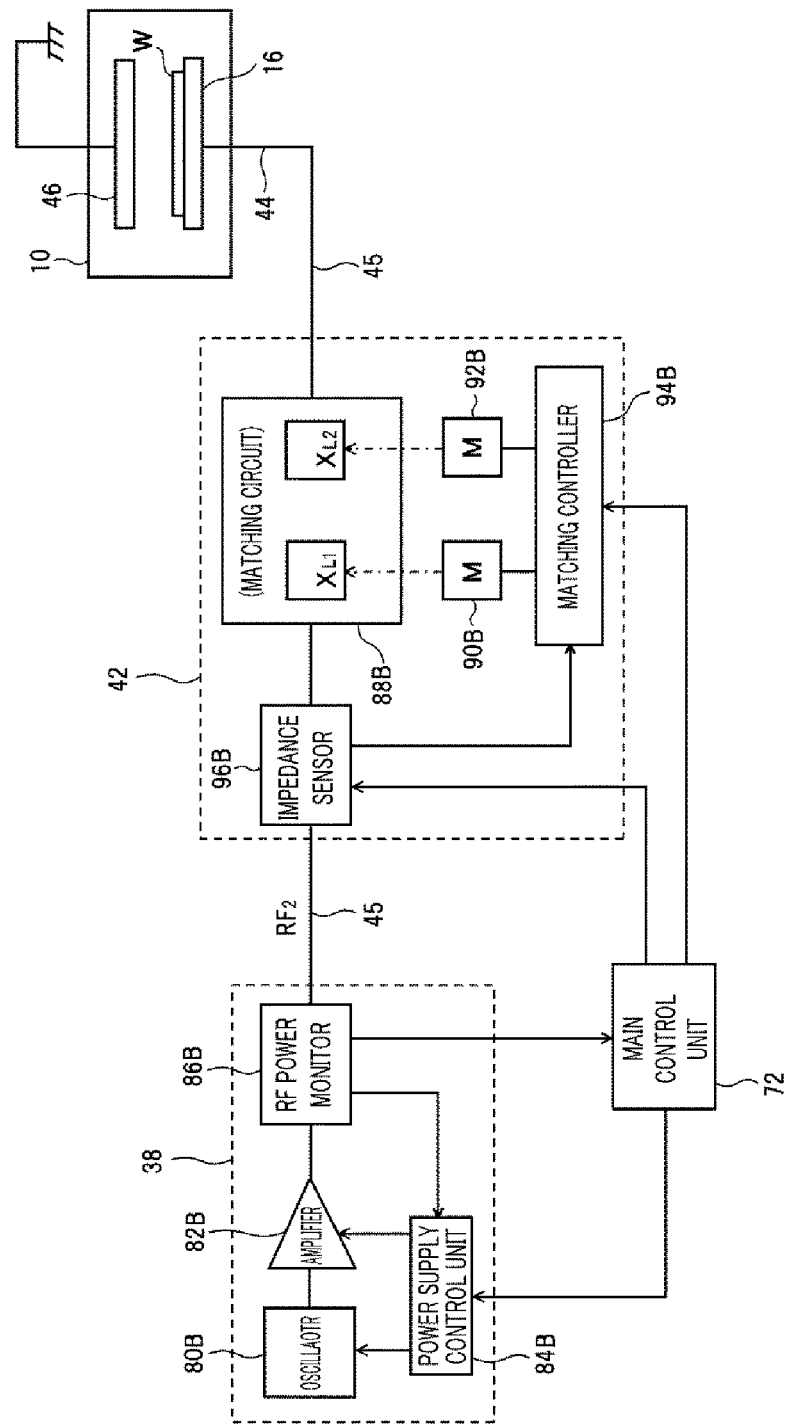
FIG. 6 is a block diagram illustrating a configuration of a matching device and a high frequency power supply for ion attraction.

FIG. 6 illustrates a configuration of the high frequency power supply 38 and a matching device 42 of the ion attraction system.

The high frequency power supply 38 includes an oscillator 80B configured to generate a sine wave of a frequency (for example, 13.56 MHz) for ion attraction; a power amplifier 82B configured to amplify a power of the sine wave outputted from the oscillator 80B with a controllable gain or amplification factor; a power supply control unit 84B configured to directly control the oscillator 80B and the power amplifier 82B in response to a control signal from the main control unit 72; and a RF power monitor 86B. The components 80B to 86B within the high frequency power supply 38 respectively have the same configurations and the same functions as the components 80A to 86A within the high frequency power supply 36 except that the frequency (13.56 MHz) of the oscillator 80B is different from the frequency (100 MHz) of the oscillator 80A. Further, the main control unit 72 and the power supply control unit 84B constitute a power modulation unit for the high frequency power $RF_2$.

The matching device 42 includes a matching circuit 88B including multiple, for example, two controllable reactance elements (for example, variable capacitors or variable inductors) $X_{L1}$ and $X_{L2}$; a matching controller 94B configured to control reactances of the reactance elements $X_{L1}$ and $X_{L2}$ via actuators, for example, motors (M) 90B and 92B; and an impedance sensor 96B configured to measure load impedance including impedance of the matching circuit 88B on the high frequency transmission line 45.

Figure 7:
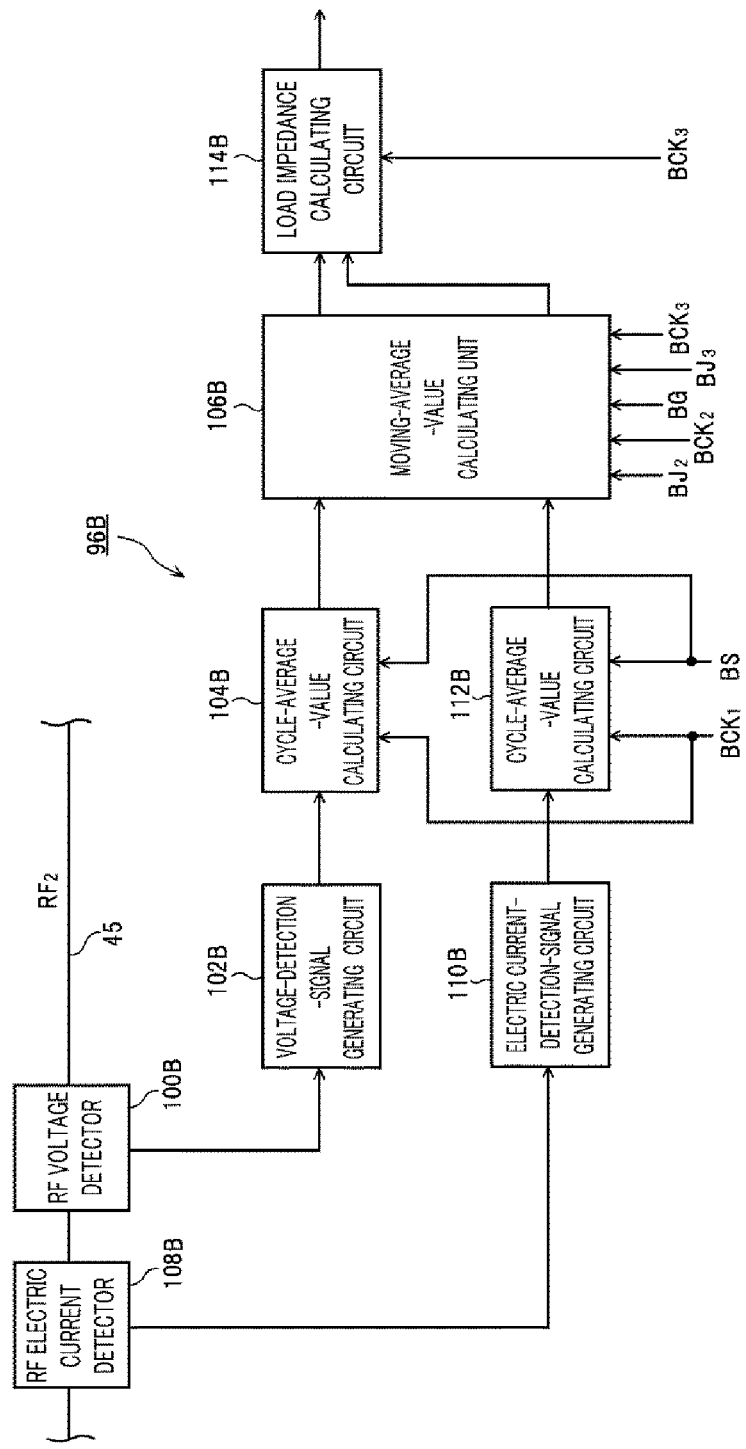
FIG. 7 is a block diagram illustrating a configuration of an impedance sensor provided in the matching device of FIG. 6.

FIG. 7 illustrates an internal configuration of the impedance sensor 96B. This impedance sensor 96B includes a RF voltage detector 100B of a voltage sensor system; a voltage-detection-signal generating circuit 102B; a cycle-average-value calculating circuit 104B and a moving-average-value calculating unit 106B of a voltage sensor system. Further, the impedance sensor 96B includes a RF electric current detector 108B; an electric current-detection-signal generating circuit 110B; a cycle-average-value calculating circuit 112B and the moving-average-value calculating unit 106B; and a load impedance calculating circuit 114B of an electric current sensor system.

The RF voltage detector 100B of the voltage sensor system is configured to detect a voltage of the high frequency power $RF_2$ on the high frequency transmission line 45. The voltage-detection-signal generating circuit 102B includes, for example, a superheterodyne filter circuit, and is configured to generate a voltage detection signal corresponding to the high frequency power $RF_2$ through the analogue filtering of a high frequency voltage detection signal outputted from the RF voltage detector 100B.

The cycle-average-value calculating circuit 104B is operated in synchronization with the power modulation of the second power modulation method, and configured to sample voltage detection signals obtained from the voltage-detection-signal generating circuit 102B with a preset frequency during a preset monitoring time $T_L$ set in a single cycle of the second pulse $PS_2$ and calculate an average value of these signals for the single cycle. In this configuration example, the analogue voltage detection signals from the voltage-detection-signal generating circuit 102B are converted into digital signals by the cycle-average-value calculating circuit 104B. A clock $BCK_1$ for sampling and a $RF_2$ monitor signal BS for indicating the monitoring time $T_L$ of the high frequency power $RF_2$ are sent to the cycle-average-value calculating circuit 104B from the main control unit 72 (FIG. 1). The cycle-average-value calculating circuit 104B is required to process large quantities of signals at a high speed in synchronization with the sampling clock $BCK_1$ of several tens of MHz or more, and, thus, a FPGA (field programmable gate array) can be used appropriately.

The RF electric current detector 108B of the electric current sensor system is configured to detect an electric current of the high frequency power $RF_2$ on the high frequency transmission line 45. The electric current-detection-signal generating circuit 110B has the same configuration and the same function as the above-described voltage-detection-signal generating circuit 102B, and is configured to generate electric current detection signals for electric currents of the high frequency power $RF_2$. The cycle-average-value calculating circuit 112B has the same configuration and the same function as the above-described cycle-average-value calculating circuit 104B, and is configured to sample the electric current detection signals obtained from the electric current-detection-signal generating circuit 110B with a preset frequency during a preset monitoring time $T_L$ set in a single cycle of the second pulse $PS_2$ and calculate an average value of these signals for the single cycle.

Appropriately, the moving-average-value calculating unit 106B is composed of a CPU. If the first and the second pulse modulation method are used simultaneously in a certain etching process, the mode of calculating the moving-average-value is switched depending on a magnitude relationship of the frequencies $f_{S1}$ and $f_{S2}$ of the first and second pulses $PS_1$ and $PS_2$, respectively.

Figure 8:
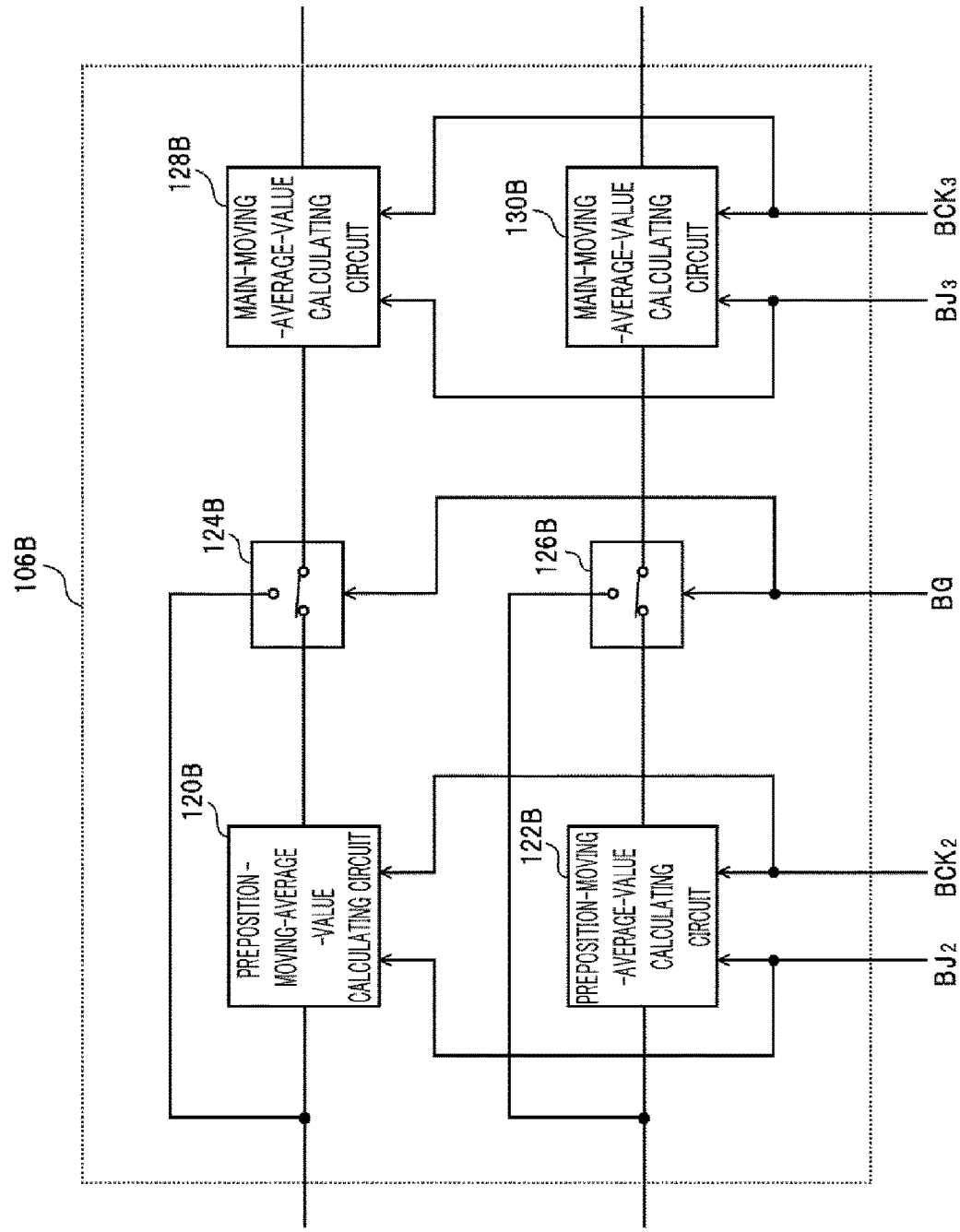
FIG. 8 is a block diagram illustrating a configuration example of a moving-average-value calculating unit provided in the impedance sensor of FIG. 7.

FIG. 8 illustrates a configuration example of the moving-average-value calculating unit 106B. In both of the voltage sensor system and the electric current sensor system, switching circuits 124B and 126B, main-moving-average-value-calculating circuits 128B and 130B, and preposition-moving-average-value-calculating circuits 120B and 122B, which have the same configuration, respectively, are provided.

Here, the preposition-moving-average-value calculating circuits 120B and 122B are operated if the frequency $f_{S2}$ of the second pulse $PS_2$ is higher than the frequency $f_{S1}$ of the first pulse $PS_1$ when the two high frequency powers $RF_1$ and $RF_2$ are simultaneously pulse-modulated with the first and second pulses $PS_1$ and $PS_2$, respectively. That is, the preposition-moving-average-value calculating circuits 120B and 122B are provided to allow the matching device 42 for the high frequency power $RF_2$, which is pulse-modulated with the second pulse $PS_2$ having the higher frequency, to cancel periodic variations in a plasma impedance which varies in synchronization with the first pulse $PS_1$ having the lower frequency (generated by on/off of the high frequency power $RF_1$).

Meanwhile, the main-moving-average-value calculating circuits 128B and 130B are always operated when the high frequency power $RF_2$ for ion attraction is pulse-modulated with the second pulse $PS_2$. That is, the main-moving-average-value calculating circuits 128B and 130B are provided to interface an operating speed (higher speed) of the cycle-average-value calculating circuits 104B and 112B configured to calculate the average value of impedance measurements for each cycle of the second pulse $PS_2$ and an operating speed (lower speed) for control the variable reactance elements $X_{L1}$ and $X_{L2}$ within the matching device 42.

To be more specific, if the frequency $f_{S2}$ of the second pulse $PS_2$ is higher than the frequency $f_{S1}$ of the first pulse $PS_1$ ($f_{S1}<f_{S2}$) when the two high frequency powers $RF_1$ and $RF_2$ are pulse-modulated at the same time, the moving-average-value calculating unit 106B is switched to a first moving-average-value calculating mode, and the preposition-moving-average-value calculating circuits 120B and 122B are operated in an active state. In this case, a control signal $BJ_2$ for indicating a moving range corresponding to the single cycle of the first pulse $PS_1$ having the lower frequency and a sampling clock $BCK_2$ for defining a moving pitch corresponding to a $BN_1$ cycle ($BN_1$ denotes an integer equal to or larger than 2 and equal to or smaller than $f_{S2}/f_{S1}$) of the second pulse $PS_2$ having the higher frequency are sent from the main control unit 72 (FIG. 1) to the preposition-moving-average-value calculating circuits 120B and 122B. Further, the switching circuits 124B and 126B are switched according to a switching control signal BG from the main control unit 72 such that the outputs of the preposition-moving-average-value calculating circuits 120B and 122B are sent to the main-moving-average-value calculating circuits 128B and 130B at the rear end thereof, respectively. A control signal $BJ_3$ for indicating a certain moving range corresponding to a $BN_2$ cycle ($BN_2$ denotes an integer equal to or larger than 2) of the first pulse $PS_1$ having the lower frequency and a sampling clock $BCK_3$ for defining a certain moving pitch corresponding to a $BN_3$ cycle ($BN_3$ denotes an integer equal to or larger than 2 and equal to or smaller $BN_2$) of the first pulse $PS_1$ are sent from the main control unit 72 to the main-moving-average-value calculating circuits 128B and 130B.

On the contrary, if the frequency $f_{S2}$ of the second pulse $PS_2$ is lower than the frequency $f_{S1}$ of the first pulse $PS_1$ ($f_{S2}<f_{S1}$), the moving-average-value calculating unit 106B is switched to a second moving-average-value calculating mode, and the preposition-moving-average-value calculating circuits 120B and 122B are not operated. According to the switching control signal BG, the switching circuits 124B and 126B are switched to send the outputs of the cycle-average-value calculating circuits 104B and 112B to the main-moving-average-value calculating circuits 128B and 130B at the rear end thereof without sending the outputs to the preposition-moving-average-value calculating circuits 120B and 122B. A control signal $BJ_3$ for indicating a certain moving range corresponding to the $BN_2$ cycle of the second pulse $PS_2$ having the lower frequency and the sampling clock $BCK_3$ for defining a certain moving pitch corresponding to the $BN_3$ cycle of the second pulse $PS_2$ are sent from the main control unit 72 to the main-moving-average-value calculating circuits 128B and 130B.

Further, if either one of the two high frequency powers $RF_1$ and $RF_2$ is pulse-modulated while the other is set as a continuous wave, the preposition-moving-average-value calculating circuits 120B and 122B are not operated, and only the main-moving-average-value calculating circuits 128B and 130B are operated, as in the second moving-average-value calculating mode.

In FIG. 7, the load impedance calculating circuit 114B is configured to calculate a measurement value of the load impedance with respect to the high frequency power supply 38 based on the moving average value of the voltage detection signals and the moving average value of the electric current detection signals received from the moving-average-value calculating unit 106B. The measurement value of the load impedance outputted from the load impedance calculating circuit 114B is updated in synchronization with the clock $BCK_3$. Typically, the measurement value of the load impedance outputted from the load impedance calculating circuit 114B includes an absolute value and a phase measurement value of the load impedance. Here, the CPU which constitutes the moving-average-value calculating unit 106B may have the function of the load impedance calculating circuit 114B as well.

Further, the load impedance on the high frequency transmission line 45 is a combination of an impedance of the chamber 10 (mainly, plasma impedance) with respect to the susceptor 16, an impedance of the matching circuit 88B, and so forth.

In FIG. 6, the matching controller 94B within the matching device 42 is configured to respond to the load impedance measurement value outputted from the impedance sensor 96B, and control the motors 90B and 92B to set the reactances of the reactance elements $X_{L1}$ and $X_{L2}$ within the matching circuit 88B such that a phase of the load impedance measurement value is zero (0) and an absolute value thereof is 50Ω.

The load impedance measurement value sent from the impedance sensor 96B to the matching controller 94B is updated in synchronization with the clock $BCK_3$ as described above. The matching controller 94B does not stop the matching operation, i.e., the control of the reactances of the reactance elements $X_{L1}$ and $X_{L2}$ during the update, and continuously controls the motors 90B and 92B such that the load impedance measurement value immediately before the update can be made equal or approximate to a matching point.

<Configuration of Main Control Unit in the Control of Impedance Sensors>

Figure 9:
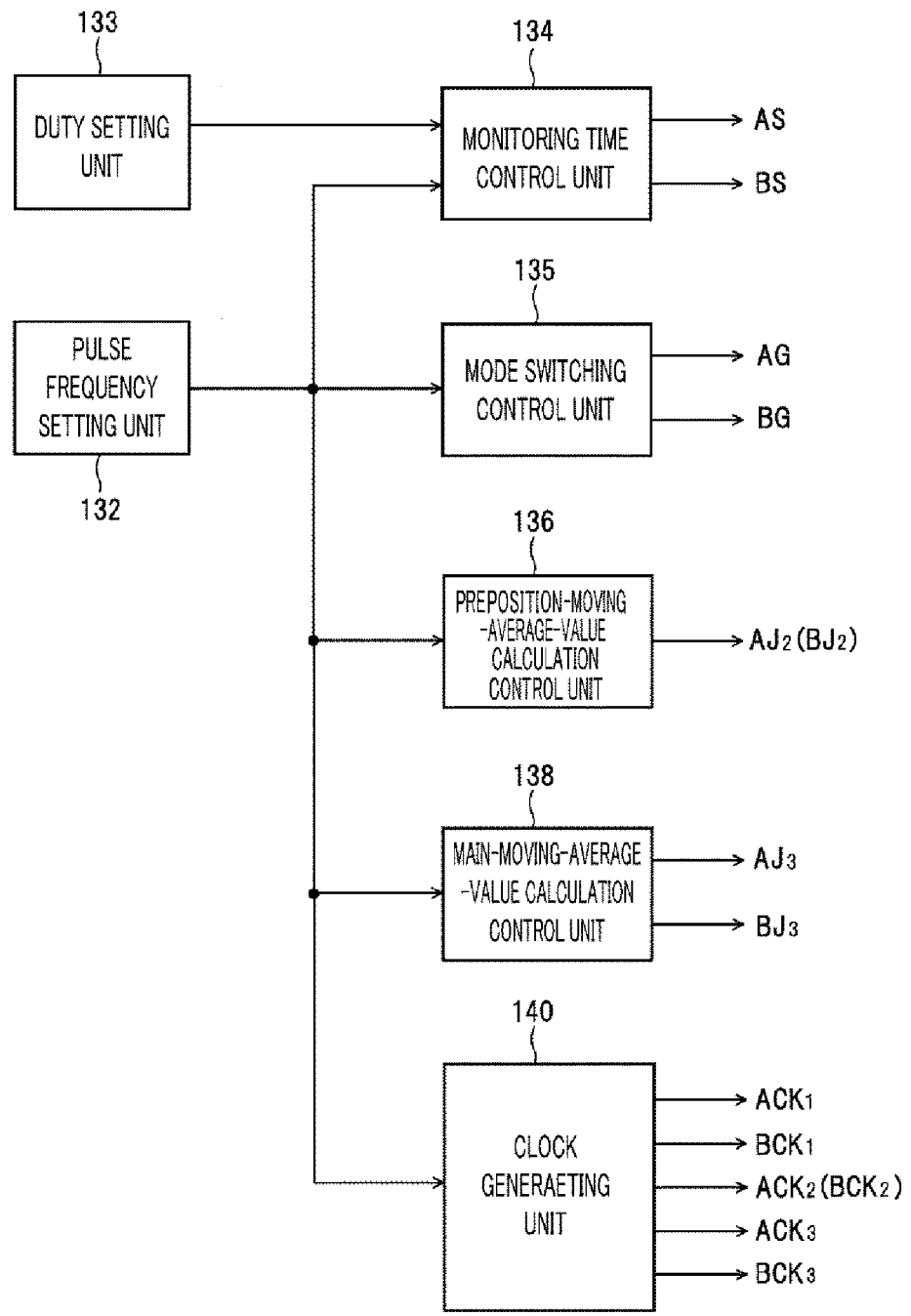
FIG. 9 is a block diagram illustrating major functions of a main controller related to a control of the impedance sensor.

FIG. 9 is a block diagram showing a configuration or a function of the main control unit 72 in the control of the impedance sensors 96A and 96B within the matching devices 40 and 42, respectively. The main control unit 72 is a functional element that is configured to control the impedance sensors 96A and 96B, and includes a pulse frequency setting unit 132, a duty setting unit 133, a monitoring time control unit 134, a mode switching control unit 135, a preposition-moving-average-value calculation control unit 136, a main-moving-average-value calculation control unit 138 and a clock generating unit 140.

The pulse frequency setting unit 132 is configured to output data indicating the frequency $f_{S1}$ of the first pulse $PS_1$ and/or the frequency $f_{S2}$ of the second pulse $PS_2$ set from an input device. The duty setting unit 133 is configured to output data indicating the duty ratio $D_{S1}$ of the on-period $T_{on1}$ in the first power modulation method and/or the duty ratio $D_{S2}$ of the on-period $T_{on2}$ in the second power modulation method set from the input device.

The monitoring time control unit 134 is configured to generate the monitoring time control signals AS and BS for defining the monitoring times $T_H$ and $T_L$ in the single cycle to the cycle-average-value calculating circuits 104A and 112A (104B and 112B) within the impedance sensors 96A and 96B, respectively, depending on the set state of each of the first and second pulses $PS_1$ and $PS_2$ (i.e., whether the high frequency powers $RF_1$ and $RF_2$ are modulated or not) and the values of the duty ratios $D_{S1}$ and $D_{S2}$, and, also, depending on the magnitude relationship of the frequencies $f_{S1}$ and $f_{S2}$ in case of the simultaneous modulation.

The mode switching control unit 135 is configured to generate the switching control signals AG and BG to the moving-average-value calculating units 106A and 106B within the impedance sensors 96A and 96B, respectively, depending on the set state of each of the first and second pulses $PS_1$ and $PS_2$ (i.e., whether the high frequency powers $RF_1$ and $RF_2$ are modulated or not) and the values of the duty ratios $D_{S1}$ and $D_{S2}$, and, also, depending on the magnitude relationship of the frequencies $f_{S1}$ and $f_{S2}$ in case of the simultaneous modulation.

The preposition-moving-average-value calculation control unit 136 is operated only when the simultaneous modulation is performed. When $f_{S1}>f_{S2}$, the preposition-moving average-value calculation control unit 136 generates the control signal $AJ_2$ for indicating the moving range and the moving pitch to the preposition-moving-average-value calculating circuits 120A and 122A within the impedance sensor 96A, whereas, if $f_{S1}<f_{S2}$, the preposition-moving averaging control unit 136 generates the control signal $BJ_2$ for indicating the moving range and the moving pitch to the preposition-moving-average-value calculating circuits 120B and 122B within the impedance sensor 96B.

The main-moving-average-value calculation control unit 138 is configured to generate the control signals $AJ_3$ and $BJ_3$ for defining the moving range and the moving pitch to the main-moving-average-value calculating circuits 128A and 130A (128B and 130B) within the impedance sensor 96A (96B), respectively, depending on the set state of each of the first and second pulses $PS_1$ and $PS_2$ (i.e., whether the high frequency powers $RF_1$ and $RF_2$ are modulated or not) and the values of the duty ratios $D_{S1}$ and $D_{S2}$, and, also, depending on the magnitude relationship of the frequencies $f_{S1}$ and $f_{S2}$ in case of the simultaneous modulation. That is, when the simultaneous modulation is performed on the high frequency powers $RF_1$ and $RF_2$ with the relationship of $f_{S1}>f_{S2}$, the control signals $AJ_3$ and $BJ_3$ for defining the moving range and the moving pitch, in which the single cycle of the second pulse $PS_2$ having the lower frequency is used as a basic cycle, is sent to the main-moving-average-value calculating circuits 128A and 130A (128B and 130B), respectively. Meanwhile, when the simultaneous modulation is performed with the relationship of $f_{S1}<f_{S2}$, the control signals $AJ_3$ and $BJ_3$ for defining the moving range and the moving pitch, in which the single cycle of the first pulse $PS_1$ having the lower frequency is used as a basic cycle, is sent to the main-moving-average-value calculating circuits 128A and 130A (128B and 130B), respectively.

If the simultaneous modulation is not performed on the high frequency powers $RF_1$ and $RF_2$, the main-moving-average-value calculation control unit 138 outputs the control signal $AJ_3$ indicating the moving range and the moving pitch, in which the single cycle of the first pulse $PS_1$ is used as a basic cycle, to the main-moving-average-value calculating circuits 128A and 130A within the impedance sensor 96A. Further, the main-moving-average-value calculation control unit 138 also outputs the control signal $BJ_3$ indicating the moving range and the moving pitch, in which the single cycle of the second pulse $PS_2$ is used as a basic cycle, to the main-moving-average-value calculating circuits 128B and 130B within the impedance sensor 96B.

The clock generating unit 140 is configured to output the regular sampling clocks $ACK_1$ and $BCK_1$ to the cycle-average-value calculating circuits 104A and 112A (104B and 112B) within the impedance sensor 96A (96B), respectively, regardless of whether either one of the high frequency powers $RF_1$ and $RF_2$ is modulated or both of them are simultaneously modulated.

When the two high frequency powers $RF_1$ and $RF_2$ are simultaneously modulated, if $f_{S1}>f_{S2}$, the clock generating unit 140 outputs the clock $ACK_2$ synchronized with the first pulse $PS_1$ having the higher frequency to the preposition-moving-average-value calculating circuits 120A and 122A within the impedance sensor 96A, and outputs the clock $BCK_3$ synchronized with the second pulse $PS_2$ having the lower frequency to the main-moving-average-value calculating circuits 128A and 130A within the impedance sensor 96A and the main-moving-average-value calculating circuits 128B and 130B within the impedance sensor 96B. Meanwhile, if $f_{S1}<f_{S2}$, the clock generating unit 140 outputs the clock $BCK_2$ synchronized with the second pulse $PS_2$ having the higher frequency to the preposition-moving-average-value calculating circuits 120B and 122B within the impedance sensor 96B, and outputs the clocks $ACK_3$ and $BCK_3$ synchronized with the first pulse $PS_1$ having the lower frequency to the main-moving-average-value calculating circuits 128A and 130A within the impedance sensor 96A and the main-moving-average-value calculating circuits 128B and 130B within the impedance sensor 96B.

If the simultaneous modulation is not performed on the high frequency powers $RF_1$ and $RF_2$, the clock generating unit 140 does not generate the clocks $ACK_2$ and $BCK_2$, and outputs the clock $ACK_3$ synchronized with the first pulse $PS_1$ to the main-moving-average-value calculating circuits 128A and 130A within the impedance sensor 96A and outputs the clock $BCK_3$ synchronized with the second pulse $PS_2$ to the main-moving-average-value calculating circuits 128B and 130B within the impedance sensor 96B.

<Operation of Matching Device>

Figure 10:
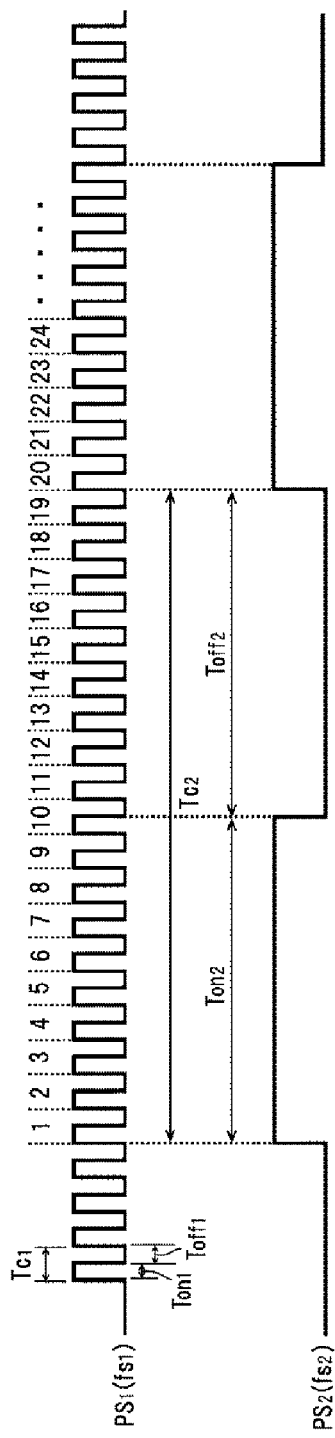
FIG. 10 is a diagram showing an example magnitude relationship of a first pulse frequency and a second pulse frequency in a simultaneous modulation in the plasma processing apparatus.

Now, there will be described operations within the matching devices 40 and 42 in case of pulse-modulating the first high frequency power $RF_1$ for plasma generation through the first modulation method with the first pulse $PS_1$ while concurrently pulse-modulating the second high frequency power $RF_2$ for ion attraction through the second power modulation method with the second pulse $PS_2$. As an example, as depicted in FIG. 10, the description will be provided for an example case where the frequency $f_{S1}$ of the first pulse $PS_1$ is higher than the frequency $f_{S2}$ of the second pulse $PS_2$ with a relationship of $f_{S1}=19*f_{S2}$.

Figure 11A:
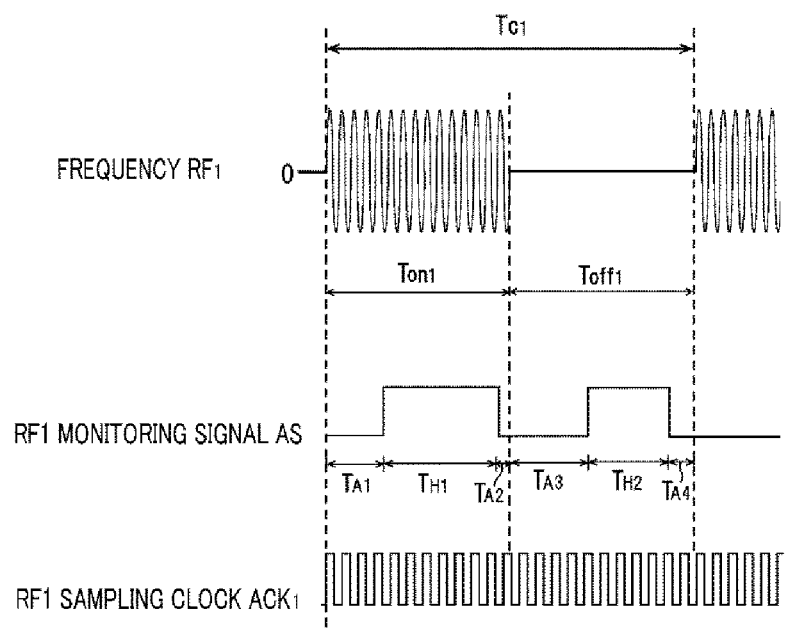
FIG. 11A is a diagram showing an operation of a cycle-average-value calculating circuit in the impedance sensor for plasma generation system having a higher frequency of modulation pulse in the simultaneous modulation.

In such a case, in the plasma generation system of pulse-modulating the first high frequency power $RF_1$ with the first pulse $PS_1$, the monitoring times $T_{H1}$ and $T_{H2}$ are set in the on-period $T_{on1}$ and the off-period $T_{off1}$ within a single cycle of the first pulse $PS_1$, respectively, as depicted in FIG. 11A. The cycle-average-value calculating circuit 104A of the voltage sensor system within the impedance sensor 96A performs sampling of the voltage detection signals from the voltage-detection-signal generating circuit 102A with a cycle of the clock $ACK_1$ during the monitoring times $T_{H1}$ and $T_{H2}$ set in each cycle of the first pulse $PS_1$ and calculates an average value a of these signals for the single cycle. The cycle-average-value calculating circuit 112A of the electric current sensor system is also operated at the same timing, and performs sampling of the electric current detection signals with a cycle of the clock $ACK_1$ during the monitoring times $T_{H1}$ and $T_{H2}$ set in each cycle of the first pulse $PS_1$ and calculates an average value a of the electric current detection signals from the electric-current-detection signal generating circuit 110A for the single cycle.

Accordingly, in the impedance sensor 96A of the plasma generation system, the cycle-average-value calculating circuit 104A of the voltage sensor system and the cycle-average-value calculating circuit 112A of the electric current sensor system substantially perform sampling of the load impedance Z on the high frequency transmission line 43 with a cycle of the clock $ACK_1$ during the monitoring times $T_{H1}$ and $T_{H2}$ set in each cycle of the first pulse $PS_1$ and calculate an average value $Z_a$ thereof for the single cycle.

Figure 11B:
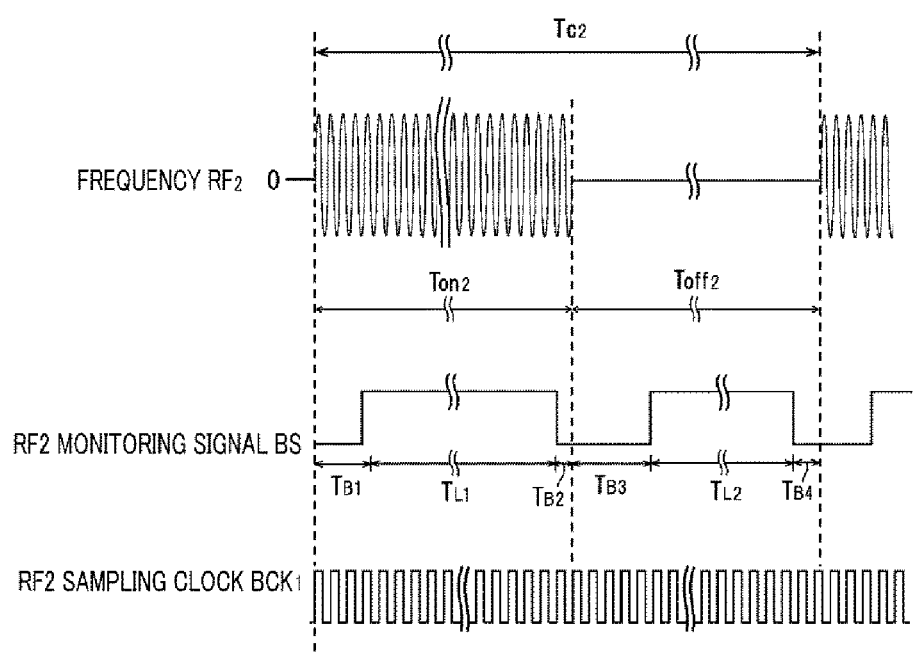
FIG. 11B is a diagram showing an operation of a cycle-average-value calculating circuit in the impedance sensor for ion attraction system having a lower frequency of modulation pulse in the simultaneous modulation.

Meanwhile, in the impedance sensor 96B of the ion attraction system of pulse-modulating the high frequency power $RF_2$ with the second pulse $PS_2$, the monitoring times $T_{L1}$ and $T_{L2}$ are set in the on-period $T_{on2}$ and the off-period $T_{off2}$ within a single cycle of the second pulse $PS_2$, respectively, as depicted in FIG. 11B. The cycle-average-value calculating circuit 104B of the voltage sensor system within the impedance sensor 96B performs sampling of the voltage detection signals from the voltage-detection-signal generating circuit 102B with a cycle of the clock $BCK_1$ during the monitoring times $T_{L1}$ and $T_{L2}$ set in each cycle of the second pulse $PS_2$ and calculates an average value b of these signals for the single cycle. The cycle-average-value calculating circuit 112B of the electric current sensor system is also operated at the same timing, and performs sampling of the electric current detection signals with a cycle of the clock $BCK_1$ during the monitoring times $T_{L1}$ and $T_{L2}$ set in each cycle of the second pulse $PS_2$ and calculates an average value b of the electric current detection signals from the electric-current-detection signal generating circuit 110B for the single cycle.

Accordingly, in the impedance sensor 96B of the plasma generation system, the cycle-average-value calculating circuit 104B of the voltage sensor system and the cycle-average-value calculating circuit 112B of the electric current sensor system substantially performs sampling of the load impedance Z on the high frequency transmission line 45 with a cycle of the clock $BCK_1$ during the monitoring times $T_{L1}$ and $T_{L2}$ set in each cycle of the second pulse $PS_2$ and calculate an average value $Z_b$ thereof for the single cycle.

Figure 12:
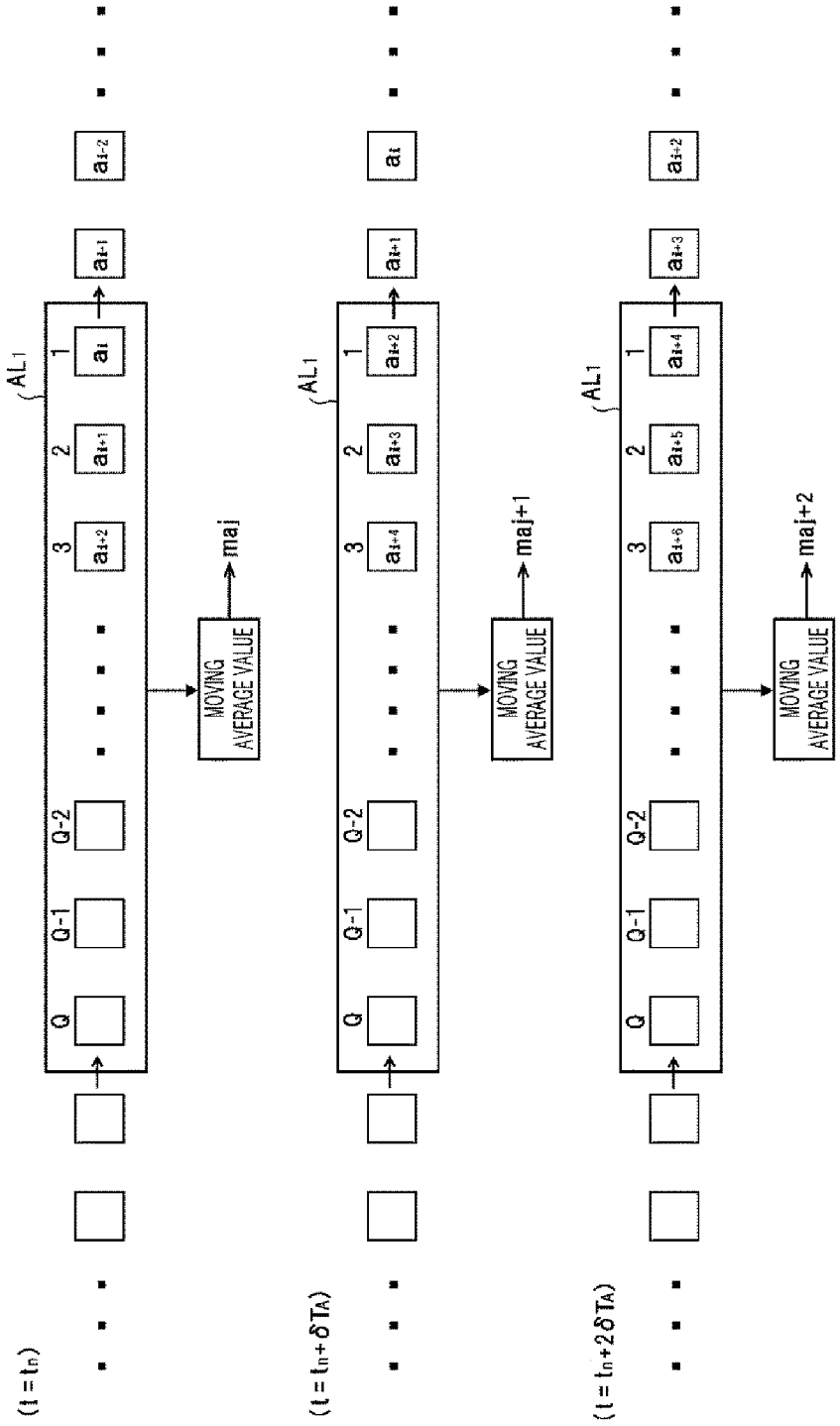
FIG. 12 is a diagram illustrating a structure of a preposition-moving-average-value calculating process in the impedance sensor of the plasma generation system in the simultaneous modulation.

In the impedance sensor 96A of the plasma generation system, as shown in FIG. 12, the preposition-moving-average-value calculating circuit 120A of the voltage sensor system sequentially receives data of the average values a for each cycle of the first pulse $PS_1$ outputted from the cycle-average-value calculating circuit 104A. Then, the preposition-moving-average-value calculating circuit 120A performs sampling of Q number of (nineteen (19) in the example shown in FIG. 10) consecutive average values a of the voltage detection signals within a moving range $AL_1$ corresponding to the single cycle of the second pulse $PS_2$ with a cycle of the clock $ACK_2$, and calculates a primary moving average value ma of those Q number of (19) average values a. Then, by moving the sampling range or the moving range $AL_1$ with a preset moving pitch (2 in the shown example) on a time scale, the above-stated calculation of the primary moving average value is repeated. The preposition-moving-average-value calculating circuit 122A of the electric current sensor system is also operated at the same timing, and calculates a primary moving average value ma within the moving range $AL_1$ with a cycle of the clock $ACK_2$, repeatedly.

Accordingly, the preposition-moving-average-value calculating circuit 120A of the voltage sensor system and the preposition-moving-average-value calculating circuit 122A of the electric current sensor system repeatedly calculate a primary moving average value $Z_{ma}$ of the load impedance on the high frequency transmission line 43 within the moving range $AL_1$ with a cycle of the clock $ACK_2$.

Figure 13:
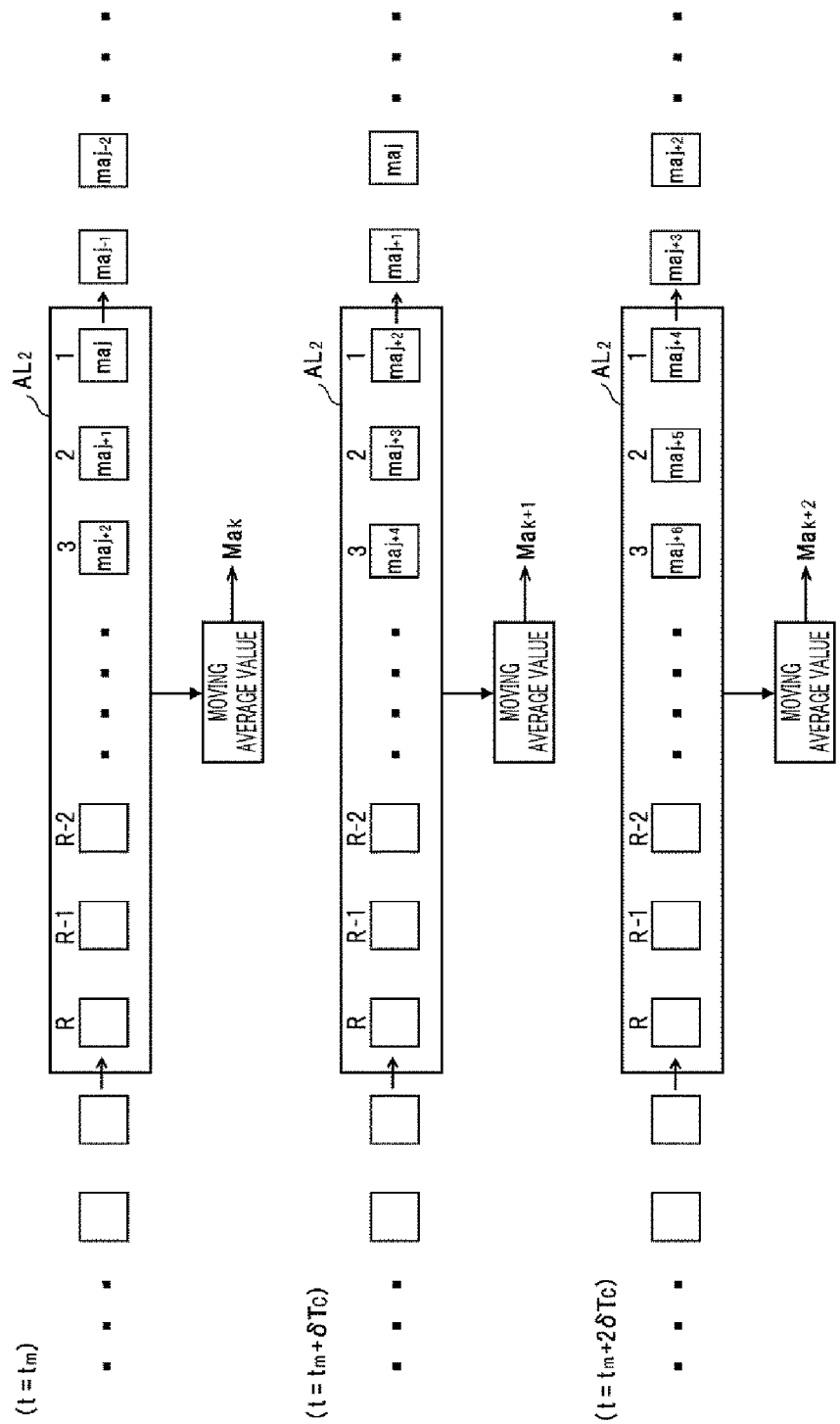
FIG. 13 is a diagram illustrating a structure of a main-moving-average-value calculating process in the impedance sensor of the plasma generation system in the simultaneous modulation.

As shown in FIG. 13, the main-moving-average-value calculating circuit 128A of the voltage sensor system sequentially receives data of the primary moving average value ma outputted from the preposition-moving-average-value calculating circuit 120A. Then, the main-moving-average-value calculating circuit 128A performs sampling of R number of consecutive primary average values ma of the voltage detection signals within a moving range $AL_2$ corresponding to the $AN_2$ cycle of the second pulse $PS_2$ with a cycle of the clock $ACK_3$, and calculates a secondary moving average value Ma from the R number of primary moving average values ma. Then, by moving the sampling range or the moving range $AL_2$ with a preset moving pitch (2 in the shown example) on a time scale, the above-stated calculation of the secondary moving average value is repeated. The main-moving-average-value calculating circuit 130A of the electric current sensor system is also operated at the same timing, and calculates an average value within the moving range $AL_2$, i.e., a secondary moving average value Ma with a cycle of the clock $ACK_3$, repeatedly.

The load impedance calculating circuit 114A calculates a load impedance measurement value $Z_{Ma}$ with a cycle of the clock $ACK_3$ based on the secondary moving average value Ma of the voltage detection signals and the secondary moving average value Ma of the electric current detection signals outputted from the moving-average-value calculating unit 106A. The matching controller 94A within the matching device 40 responds to the load impedance measurement value $Z_{Ma}$ outputted from the load impedance calculating circuit 114A within the impedance sensor 96A with the cycle of the clock $ACK_3$, and control the reactances of the reactance elements $X_{H1}$ and $X_{H2}$ within the matching circuit 88A by adjusting the motors 90A and 92A such that a phase of the load impedance measurement value $Z_{Ma}$ is zero (0) and an absolute value thereof is 50Ω.

Figure 14:
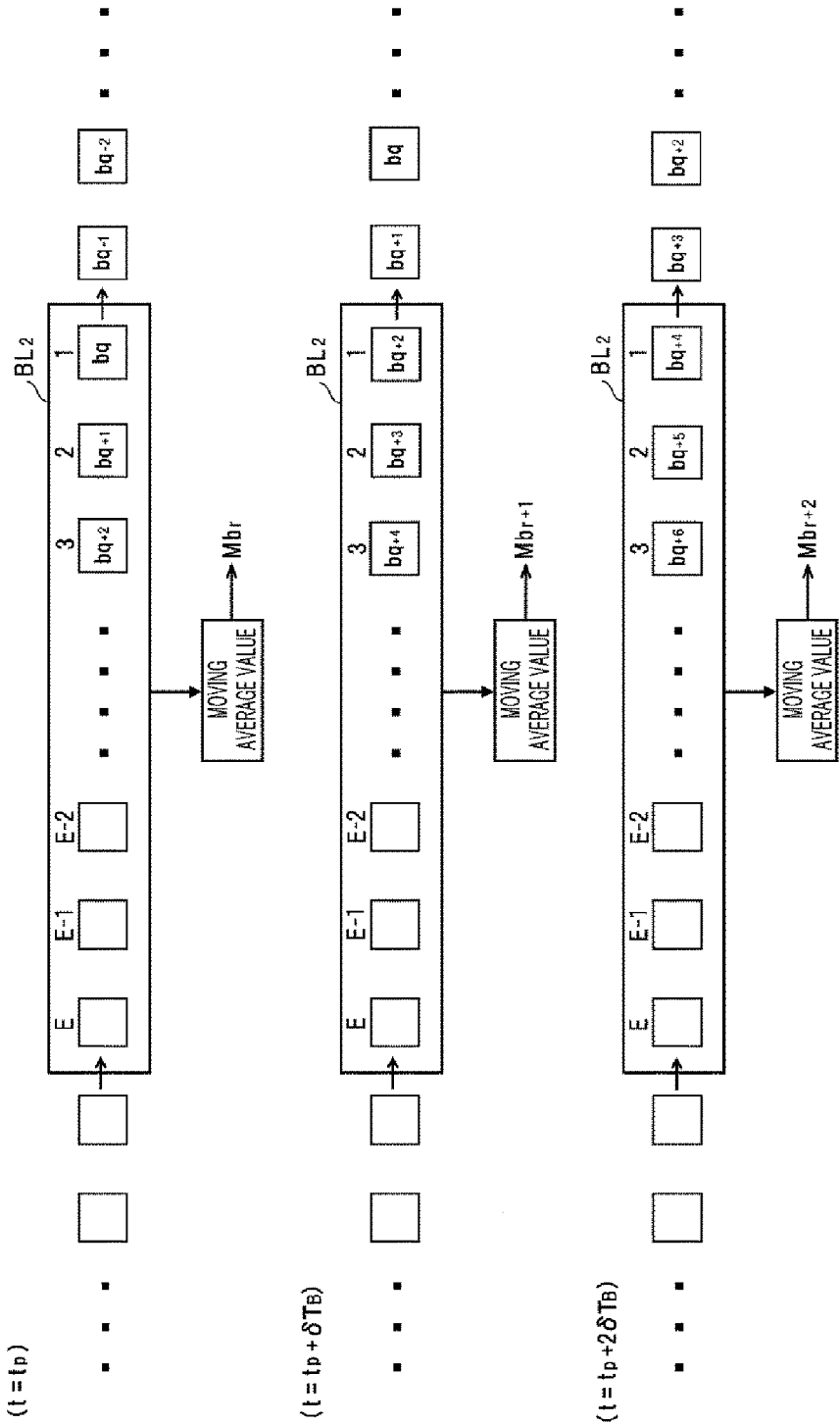
FIG. 14 is a diagram illustrating a structure of a main-moving-average-value calculating process in the impedance sensor of the ion attraction system in the simultaneous modulation.

Meanwhile, in the impedance sensor 96B of the ion attraction system, as shown in FIG. 14, the main-moving-average-value calculating circuit 128B of the voltage sensor system sequentially receives data of average values b sent from the cycle-average-value calculating circuit 104B without passing through the preposition-moving-average-value calculating circuit 120B. Then, the main-moving-average-value calculating circuit 128B of the voltage sensor system performs sampling of E number of consecutive average values b of the voltage detection signals within a moving range $BL_2$ corresponding to the $BN_2$ cycle of the second pulse $PS_2$ with a cycle of the clock $BCK_3$, and calculates a moving average value Mb of those E number of average values b. Then, by moving the sampling range or the moving range $BL_2$ with a preset moving pitch (2 in the shown example) on a time scale, the above-stated calculation of the moving average value is repeated. The main-moving-average calculating circuit 130B of the electric current sensor system also repeatedly calculates a moving average value within the moving range $BL_2$, i.e., a moving average value Mb with a cycle of the clock $BCK_3$.

The load impedance calculating circuit 114B calculates a load impedance measurement value $Z_{Mb}$ with a cycle of the clock $BCK_3$ based on the moving average value Mb of the voltage detection signals and the moving average value Mb of the electric current detection signals outputted from the moving-average-value calculating unit 106B. The matching controller 94B within the matching device 42 responds to the load impedance measurement value $Z_{Mb}$ outputted from the load impedance calculating circuit 114B within the impedance sensor 96B with the cycle of the clock $BCK_3$, and controls the reactances of the reactance elements $X_{L1}$ and $X_{L2}$ within the matching circuit 88B by adjusting the motors 90B and 92B such that a phase of the load impedance measurement value $Z_{Mb}$ is zero (0) and an absolute value thereof is 50Ω.

As stated above, in the present example embodiment, when pulse-modulating the high frequency power $RF_1$ for plasma generation and the high frequency power $RF_2$ for ion attraction with the first pulse $PS_1$ and the second pulse $PS_2$ having different frequencies, respectively, the impedance sensor 96A in the matching device 40 of the plasma generation system calculates the average value (primary moving average value ma) of the load impedance on the high frequency transmission line 43 for each cycle of the second pulse $PS_2$ having a lower frequency, and outputs the load impedance measurement value $Z_{Ma}$ based on those average values ma of the load impedance. Then, the matching controller 94A controls the reactances of the reactance elements $X_{H1}$ and $X_{H2}$ within the matching circuit 88A such that the load impedance measurement value $Z_{Ma}$ from the impedance sensor 96A can be equal or approximate to the matching point (50Ω).

Meanwhile, the impedance sensor 96B in the matching device 42 of the ion attraction system calculates the average value Mb of the load impedance on the high frequency transmission line 45 for each cycle of the second pulse $PS_2$ having the lower frequency, and outputs the load impedance measurement value $Z_{Mb}$ based on those average values Mb of the load impedance. Then, the matching controller 94B controls the reactances of the reactance elements $X_{L1}$ and $X_{L2}$ within the matching circuit 88B such that the load impedance measurement value $Z_{Mb}$ from the impedance sensor 96B can be equal or approximate to the matching point (50Ω).

In accordance with the present example embodiment, on the high frequency transmission line 43 of the plasma generation system in which the high frequency power $RF_1$ is pulse-modulated with the first pulse $PS_1$ having the higher frequency, a periodic variation of the load impedance (mainly, a periodic variation of a plasma impedance) generated between the on-period $T_{on2}$ and the off-period $T_{off2}$ of the second pulse $PS_2$ having the lower frequency is canceled through the above-described averaging process (particularly, the preposition-moving-average-value calculating process) within the impedance sensor 96A. Accordingly, the matching operation of the matching device 40 can be stabilized.

That is, the load impedance (particularly, the plasma impedance) during the period (on-period $T_{on1}$ of the first pulse $PS_1$) when the matching device 40 transmits the high frequency power $RF_1$ for plasma generation on the high frequency transmission line 43, varies considerably between the on-period $T_{on2}$ and the off-period $T_{off2}$ of the second pulse $PS_2$ having the lower frequency.

Figure 15:
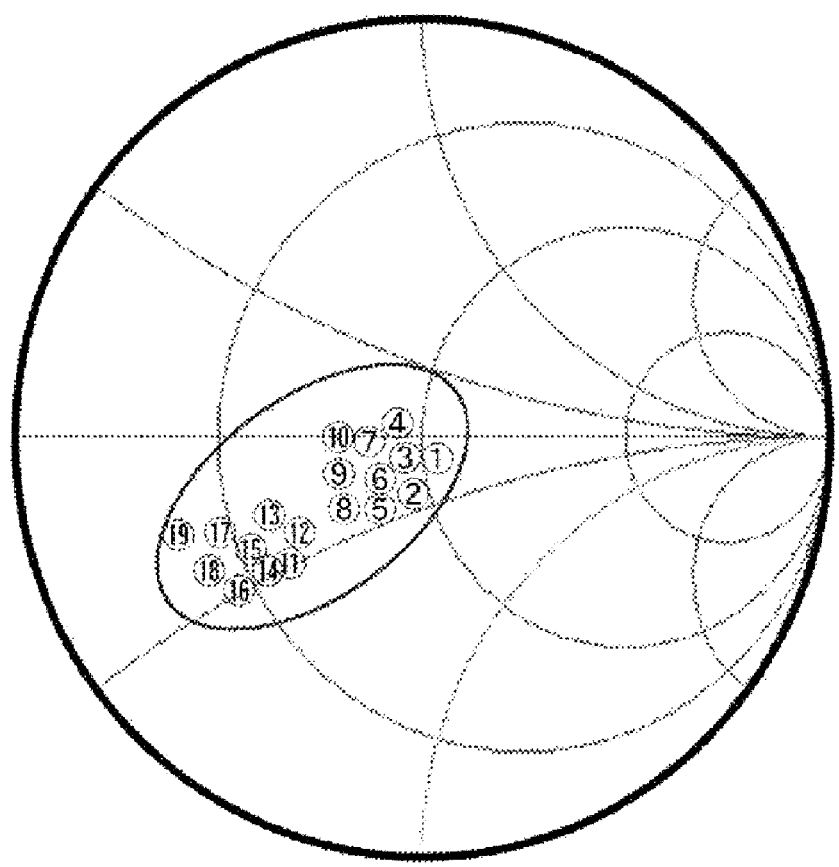
FIG. 15 is a Smith chart showing a load impedance distribution obtained every single cycle by the matching device of the plasma generation system in a comparative example (without performing a moving-average-value calculating process of an experimental example)

For this reason, if the above-described averaging process is not performed in the impedance sensor 96A (comparative example), the load impedance <1> to <10> during the on-period $T_{on2}$ and the load impedance <11> to <19> during the off-period $T_{off2}$ in the single cycle of the second pulse $PS_2$ are dispersed on a Smith chart by being divided in two groups, as shown in FIG. 15. As a result, the matching controller 94A controls the reactances of the reactance elements $X_{H1}$ and $X_{H2}$ within the matching circuit 88A in response to either one of the two groups (not fixed), so that the matching operation is not stabilized. Further, in this comparative example (FIG. 15), a monitoring time $T_H$ is set, according to the conventional method, only in the on-period $T_{on1}$ within the single cycle of the first pulse $PS_1$, and a load impedance value is calculated for each cycle.

Figure 16A:
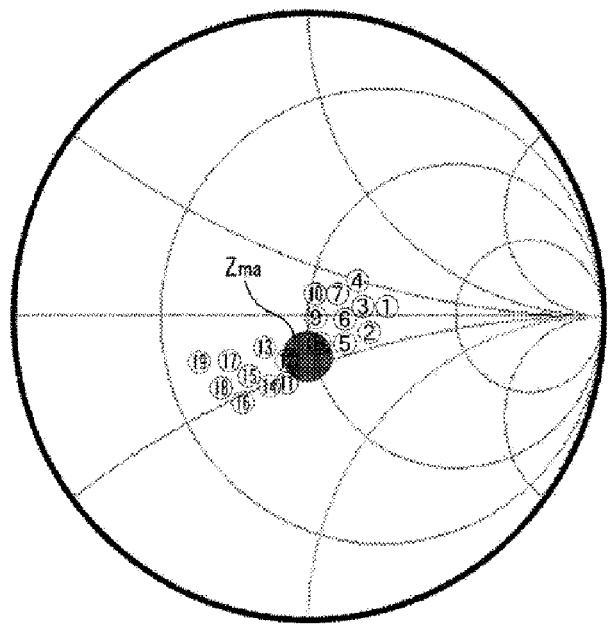
FIG. 16A is a Smith chart showing a distribution of a load impedance obtained every single cycle of the first pulse and a distribution of a moving-average-value obtained every single cycle of the second pulse in the matching device of the plasma generation system in an experimental example.
Figure 16B:
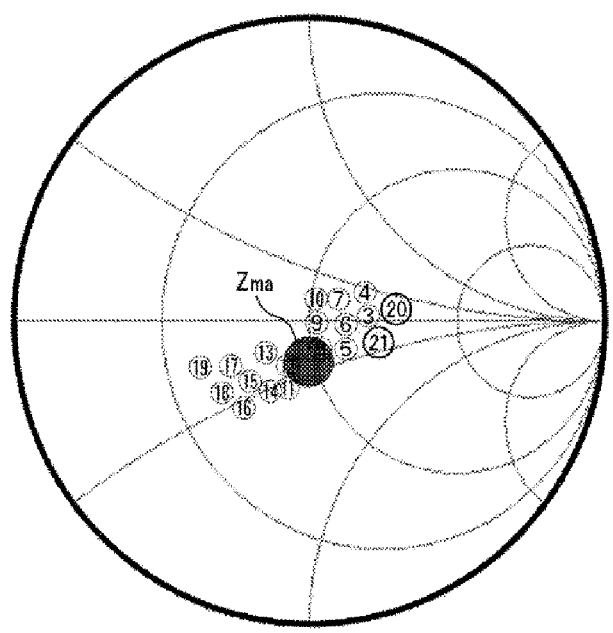
FIG. 16B is a Smith chart showing a distribution of the load impedance and a distribution of the moving-average-value when a moving range is shifted with a single moving pitch from the state in FIG. 16A.

In this regard, in accordance with the present example embodiment, even if the load impedance values obtained for each cycle of the first pulse $PS_1$ having the higher frequency are dispersed by being divided in two groups within the single cycle of the second pulse $PS_2$ having the lower frequency, the load impedance values are averaged through the above-described preposition-moving-average-value calculating process, and a moving average value $Z_{ma}$ at a mid-point between the two groups is obtained, as depicted in FIG. 16A. Further, as shown in FIG. 16B, even if a part of the load impedance values within the moving range is replaced by new values (e.g., <1>, <2>→<20>, <21>), the moving average value $Z_{ma}$ may have the substantially constant value. That is, as can be understood from FIG. 10, since the cycles [1] and [2] and the cycles [20] and [21] are substantially of the same phase between the first pulse $PS_1$ and the second pulse $PS_2$, the load impedance values <20> and <21>, which are replaced with the load impedance values <1> and <2>, are substantially equal to the load impedance values <1> and <2>. As stated, by performing the preposition-moving-average-value calculating process at a cycle of the pulse having the lower frequency, a variation rate in the average value calculation is decreased. Thus, a stable calculation result may be obtained.

Within the matching device 40, since the matching components (the matching controller 94A, the motors 90A and 92A, and the reactance elements $X_{H1}$ and $X_{H2}$) are operated such that the load impedance measurement value $Z_{Mb}$ corresponding to the moving average value $Z_{ma}$ is equal to or approximate to the matching point (50Ω), the matching operation can be performed stably.

Furthermore, even if the plasma impedance pulsates within each cycle (between the on-period $T_{on1}$ and off-period $T_{off1}$) of the first pulse $PS_1$ during the on-period $T_{on2}$ of the second pulse $PS_2$, it looks as if the high frequency power $RF_1$ for plasma generation is supplied to the impedance sensor 96B of the matching device 42 as a continuous wave. Accordingly, the matching device 42 on the high frequency transmission line 45 for transmitting the second pulse $PS_2$ having the lower frequency may perform the matching operation stably even if the aforementioned preposition-moving-average-value calculating process is not performed.

If the frequency $f_{S1}$ of the first pulse $PS_1$ is lower than the frequency $f_{S2}$ of the second pulse $PS_2$ in the simultaneous modulation, the same operations as described above may be performed in a manner where the matching device 40 of the plasma generation system is replaced with the matching device 42 of the ion attraction system.

In the above-described example embodiment, when the high frequency power $RF_1$ for plasma generation is pulse-modulated with the first pulse $PS_1$ having the higher frequency, the impedance sensor 96A of the plasma generation system sets the monitoring times $T_{H1}$ and $T_{H2}$ in the on-period $T_{on1}$ and the off-period $T_{off1}$ within the single cycle of the first pulse $PS_1$, respectively (FIG. 11A). Then, the impedance sensor 96A performs sampling of the load impedance values Z during the monitoring times $T_{H1}$ and $T_{H2}$ within each cycle of the first pulse $PS_1$ with a cycle of the clock $ACK_1$, and calculates the average value $Z_a$ for the single cycle.

In short, when the frequency $f_{S1}$ of the first pulse $PS_1$ is high, the follow-up property of the load impedance Z for the first pulse $PS_1$ is reduced. Accordingly, if the sampling process and the averaging process are performed only during the on-period $T_{on1}$, the accuracy of the average value $Z_a$ for the single cycle would be decreased. Thus, as in the above-described example embodiment, by performing the sampling of the load impedance Z even during the off-period $T_{off1}$ as well as during the on-period $T_{on1}$ within the single cycle of the first pulse $PS_1$, the accuracy of the average value $Z_a$ for the single cycle can be increased.

From another point of view, when the duty ratio $D_{S1}$ of the first pulse $PS_1$ is considerably high (over an upper limit, e.g., 80% or higher), the monitoring time $T_H$ is set only in the on-period $T_{on1}$ within the single cycle of the first pulse $PS_1$. Meanwhile, when the duty ratio $D_{S1}$ is considerably low (below a lower limit, e.g., 20% or lower), on the other hand, the monitoring time $T_H$ is set only in the off-period $T_{off1}$ within the single cycle of the first pulse $PS_1$. By setting the monitoring time $T_H$ in this way, it is possible to calculate the average value $Z_a$ for the single cycle securely and efficiently. In the plasma processing apparatus according to the above-described example embodiment, the monitoring time control unit 134 of the main control unit 72 may control such a switchover in the setting of the monitoring time.

Likewise, in the impedance sensor 96B of the ion attraction system, a control for switching the setting of a monitoring time $T_L$ can be performed depending on the duty ration $D_{S2}$ of the second pulse $PS_2$.

In addition, as depicted in FIG. 11A, in the modulation with the first pulse $PS_1$, for example, mask times $T_{A1}$ and $T_{A2}$ and mask times $T_{A3}$ and $T_{A4}$ during which the sampling for the average value calculating process is not performed are set in the on-period $T_{on1}$ and the off-period $T_{off1}$ before and after the monitoring times $T_{H1}$ and $T_{H2}$, respectively. The monitoring time control unit 134 may adjust the lengths of the mask times $T_{A1}$ and $T_{A2}$ and the mask times $T_{A3}$ and $T_{A4}$ or cancel the setting of those mask times depending on the frequency or the duty ratio of the modulation pulse.

Likewise, in the modulation with the second pulse $PS_2$, mask times $T_{B1}$ and $T_{B2}$ and mask times $T_{B3}$ and $T_{B4}$ may be set, as shown in FIG. 11B, and the lengths of the mask times $T_{B1}$ and $T_{B2}$ and mask times $T_{B3}$ and $T_{B4}$ may be adjusted or the setting of the mask times may be canceled depending on the frequency or the duty ratio of the modulation pulse.

Other Example Embodiments or Modification Examples

In the above, the example embodiment has been explained. However, the present disclosure is not limited to the above example embodiment but can be modified in various ways within the technical scope thereof.

By way of example, as illustrated in FIG. 17, the impedance sensor 96A within the matching device 40 provided on the high frequency transmission line 43 of the plasma generation system may include the RF voltage detector 100A, the RF electric current detector 108A, a load impedance instantaneous value calculating circuit 142A, a cycle-average-value calculating circuit 144A, and a moving-average-value calculating unit 146A.

Here, the load impedance instantaneous value calculating circuit 142A is configured to calculate an instantaneous value of a load impedance Z on the high frequency transmission line 43 based on the RF voltage detection signals and the RF electric current detection signals obtained from the RF voltage detector 100A and the RF electric current detector 108A, respectively. The load impedance instantaneous value calculating circuit 142A may be implemented by an analogue circuit and, more desirably, may be implemented by a high-speed digital circuit.

The cycle-average-value-calculating circuit 144A and the moving-average-value calculating unit 146A may perform the same sampling process and the averaging process as the cycle-average-value calculating circuits 104A and 112A and the moving-average-value calculating unit 106A of the above example embodiment just by replacing a signal to be processed with a signal directly indicating a value of the load impedance Z.

In this case, the matching controller 94A (FIG. 3) controls the motors 90A and 92A to set the reactances of the reactance elements $X_{H1}$ and $X_{H2}$ such that a load impedance measurement value, i.e., a moving average value $Z_{Ma}$ obtained from the moving-average-value calculating unit 146A may be equal to or approximate to a matching point corresponding to an output impedance of the high frequency power supply 36.

Figure 18:
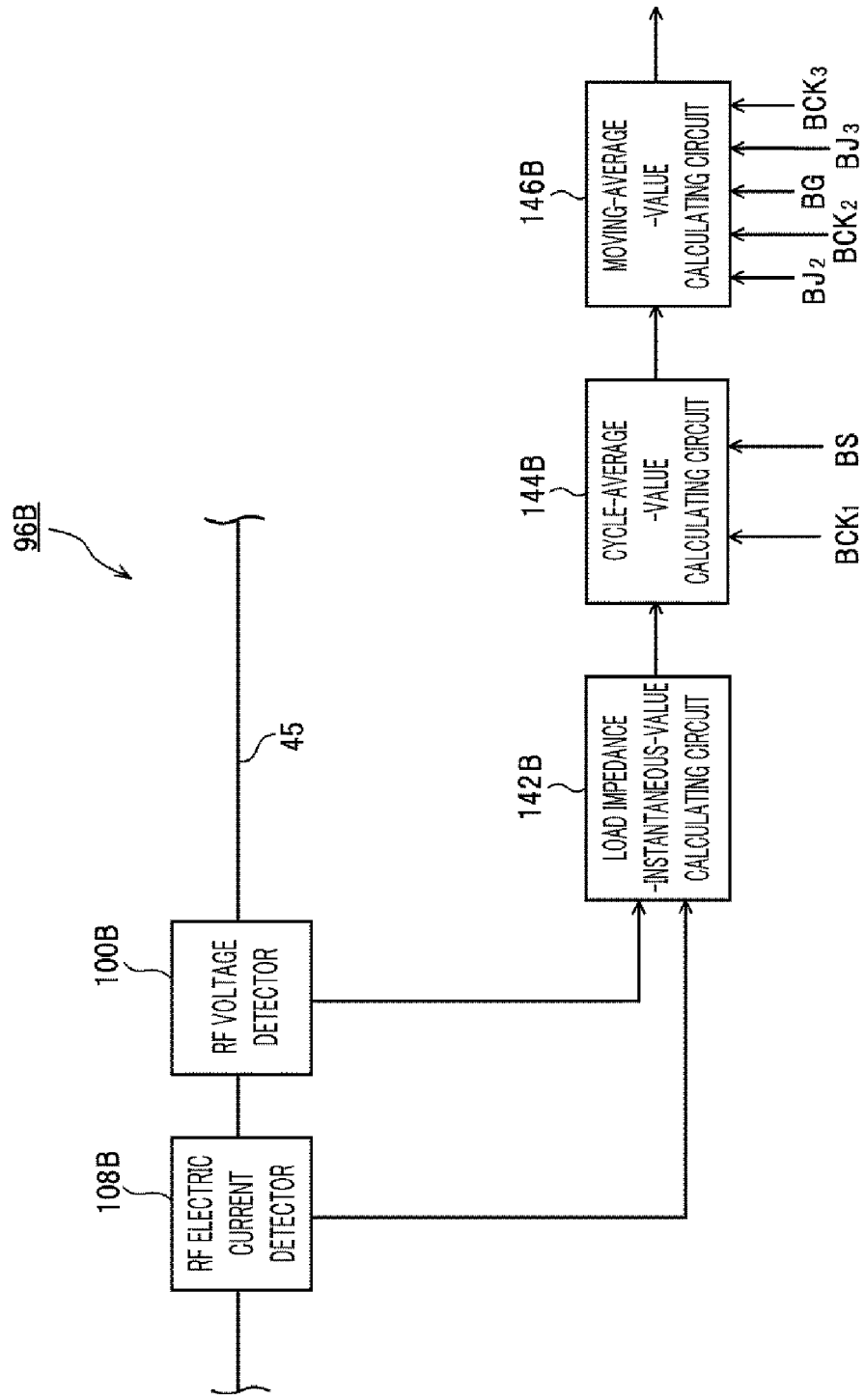
FIG. 18 is a block diagram illustrating a configuration of an impedance sensor in another modification example.

Likewise, as depicted in FIG. 18, the impedance sensor 96B within the matching device 42 provided on the high frequency transmission line 45 of the ion attraction system may include the RF voltage detector 100B, the RF electric current detector 108B, a load impedance instantaneous value calculating circuit 142B, a cycle-average-value calculating circuit 144B, and a moving-average-value calculating unit 146B.

Here, the load impedance instantaneous value calculating circuit 142B is configured to calculate an instantaneous value of a load impedance Z on the high frequency transmission line 45 based on the RF voltage detection signals and the RF electric current detection signals obtained from the RF voltage detector 100B and the RF electric current detector 108B, respectively. The load impedance instantaneous value calculating circuit 142B may be implemented by an analogue circuit and, more desirably, may be implemented by a high-speed digital circuit.

The cycle-average-value-calculating circuit 144B and the moving-average-value calculating unit 146B may perform the same sampling process and the averaging process as the cycle-average-value calculating circuits 104B and 112B and the moving-average-value calculating unit 106B of the above example embodiment just by replacing a signal to be processed with a signal directly indicating a value of the load impedance Z.

In this case, the matching controller 94B (FIG. 6) controls the motors 90B and 92B to set the reactances of the reactance elements $X_{L1}$ and $X_{L2}$ such that a load impedance measurement value, i.e., a moving average value $Z_{Mb}$ obtained from the moving-average-value calculating unit 146B may be equal to or approximate to a matching point corresponding to an output impedance of the high frequency power supply 38.

In the example embodiments, in the first power modulation method, a first period during which the high frequency power $RF_1$ has a first level and a second period during which the high frequency power $RF_1$ has a second level lower than the first level may be alternately repeated at a certain pulse frequency. Likewise, in the second power modulation method, a first period during which the high frequency power $RF_2$ has a first level and a second period during which the high frequency power $RF_2$ has a second level lower than the first level may also be repeated alternately at a certain pulse frequency.

In the above-described example embodiment (FIG. 1), the high frequency power $RF_1$ for plasma generation is applied to the susceptor (lower electrode) 16. However, the high frequency power $RF_1$ for plasma generation may be applied to the upper electrode 46.

The example embodiments may not be limited to the capacitively coupled plasma etching apparatus and can be applied to a capacitively coupled plasma processing apparatus configured to perform various plasma processes such as plasma CVD, plasma ALD, plasma oxidation, plasma nitrification, sputtering, and so forth. Furthermore, the example embodiments may also be applied to an inductively coupled plasma processing apparatus in which a high frequency electrode (antenna) is provided in the vicinity of a chamber. Further, the processing target object of the example embodiments may not be limited to the semiconductor wafer, but various types of substrates for a flat panel display, an organic EL or a solar cell, or a photo mask, a CD substrate, and a printed circuit board may also be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plasma processing apparatus of generating plasma by high frequency discharge of a processing gas within a decompression processing vessel that accommodates therein a processing target object, which is loaded into and unloaded from the processing vessel, and performing a process on the processing target object within the processing vessel under the plasma, the plasma processing apparatus comprising:
   a first high frequency power supply configured to output a first high frequency power;
   a first high frequency transmission line configured to transmit the first high frequency power outputted from the first high frequency power supply to a first electrode provided within or in the vicinity of the processing vessel;

a first matching device, having a first variable reactance element and a first impedance sensor provided on the first high frequency transmission line, configured to control a reactance of the first variable reactance element such that a first load impedance measurement value outputted from the first impedance sensor is equal to or approximate to a first matching point corresponding to an output impedance of the first high frequency power supply;

a first high frequency power modulation unit configured to pulse-modulate an output of the first high frequency power supply with a first pulse such that a first period during which the first high frequency power is turned on or has a first level and a second period during which the first high frequency power is turned off or has a second level lower than the first level are alternately repeated at a regular frequency;

a second high frequency power supply configured to output a second high frequency power;

a second high frequency transmission line configured to transmit the second high frequency power outputted from the second high frequency power supply to the first electrode or a second electrode provided within or in the vicinity of the processing vessel;

a second matching device, having a second variable reactance element and a second impedance sensor provided on the second high frequency transmission line, configured to control a reactance of the second variable reactance element such that a second load impedance measurement value outputted from the second impedance sensor is equal to or approximate to a second matching point corresponding to an output impedance of the second high frequency power supply; and a second high frequency power modulation unit configured to pulse-modulate an output of the second high frequency power supply with a second pulse by alternately repeating a third period during which the second high frequency power is turned on or has a third level and a fourth period during which the second high frequency power is turned off or has a fourth level lower than the third level at a regular frequency lower than a frequency of the first pulse, wherein the first impedance sensor calculates an average value of the load impedance by using a single cycle of the second pulse as a basic cycle, and outputs the first load impedance measurement value based on the average value of the load impedance, and the second impedance sensor calculates an average value of the load impedance by using the single cycle of the second pulse as a basic cycle, and outputs the second load impedance measurement value based on the average value of the load impedance, and wherein the first impedance sensor comprises:

a first cycle-average-value calculating circuit configured to sample voltage detection signals and electric current detection signals corresponding to the first high frequency power on the first high frequency transmission line with a preset sampling frequency during a first monitoring time set in either one of the first period and the second period in a single cycle of the first pulse and calculate an average value of the voltage detection signals and the electric current detection signals for the single cycle;

a preposition-moving-average-value calculating circuit configured to calculate, by setting the single cycle of the second pulse as a moving range, a primary moving average value of multiple consecutive average values of the voltage detection signals for the single cycle and multiple consecutive average values of the electric current detection signals for the single cycle obtained from the first cycle-average-value calculating circuit;

a first main-moving-average-value calculating circuit configured to calculate, by setting an $AN_2$ cycle of the second pulse as a moving range, a secondary moving average value of multiple consecutive primary average values of the voltage detection signals and a secondary moving average value of multiple consecutive primary average values of the electric current detection signals obtained from the preposition-moving-average-value calculating circuit; and a first load impedance calculating circuit configured to calculate the first load impedance measurement value based on the secondary moving average values of the voltage detection signals and the electric detection signals obtained from the first moving-average-value calculating circuit, wherein the $AN_2$ is an integer equal to or larger than 2.

2. The plasma processing apparatus of claim 1, wherein the first impedance sensor comprises:

a first cycle-average-value calculating circuit configured to sample instantaneous values of the load impedance on the first high frequency transmission line with a preset sampling frequency during a first monitoring time set in either one of the first period and the second period in a single cycle of the first pulse and calculate an average value of the load impedance for the single cycle;

a preposition-moving-average-value calculating circuit configured to calculate, by setting the single cycle of the second pulse as a moving range, a primary moving average value of multiple consecutive average values of the load impedance for the single cycle obtained from the first cycle-average-value calculating circuit; and a first main-moving-average-value calculating circuit configured to calculate, by setting an $AN_2$ cycle of the second pulse as a moving range, a secondary moving average value of multiple consecutive primary average values of the load impedance obtained from the preposition-moving-average-value calculating circuit as the first load impedance measurement value, wherein the $AN_2$ is an integer equal to or larger than 2.

3. The plasma processing apparatus of claim 1, wherein the first monitoring time is set in both of the first period and the second period within the single cycle of the first pulse.

4. The plasma processing apparatus of claim 1, wherein if a duty ratio of the first period set by the first high frequency power modulation unit is equal to or higher than a first upper limit, the first monitoring time is set only in the first period in the single cycle of the first pulse, if the duty ratio is equal to or lower than a first lower limit lower than the first upper limit, the first monitoring time is set only in the second period in the single cycle of the first pulse, and if the duty ratio is between the first lower limit and the first upper limit, the first monitoring time is set in both of the first period and the second period in the single cycle of the first pulse.

5. The plasma processing apparatus of claim 1,
wherein the second impedance sensor comprises:
a second cycle-average-value calculating circuit configured to sample instantaneous values of the load impedance on the second high frequency transmission line with a preset sampling frequency during a second monitoring time set in either one of the first period and the second period in a single cycle of the second pulse and calculate an average value of the load impedance for the single cycle; and
a second main-moving-average-value calculating circuit configured to calculate, by setting a $BN_2$ cycle of the second pulse as a moving range, a moving average value of multiple consecutive average values of the load impedance obtained from the second cycle-average-value calculating circuit as the second load impedance measurement value,
wherein the $BN_2$ is an integer equal to or larger than 2.

6. A plasma processing apparatus of generating plasma by high frequency discharge of a processing gas within a decompression processing vessel that accommodates therein a processing target object, which is loaded into and unloaded from the processing vessel, and performing a process on the processing target object within the processing vessel under the plasma, the plasma processing apparatus comprising:
a first high frequency power supply configured to output a first high frequency power;
a first high frequency transmission line configured to transmit the first high frequency power outputted from the first high frequency power supply to a first electrode provided within or in the vicinity of the processing vessel;
a first matching device, having a first variable reactance element and a first impedance sensor provided on the first high frequency transmission line, configured to control a reactance of the first variable reactance element such that a first load impedance measurement value outputted from the first impedance sensor is equal to or approximate to a first matching point corresponding to an output impedance of the first high frequency power supply;
a first high frequency power modulation unit configured to pulse-modulate an output of the first high frequency power supply with a first pulse such that a first period during which the first high frequency power is turned on or has a first level and a second period during which the first high frequency power is turned off or has a second level lower than the first level are alternately repeated at a regular frequency;
a second high frequency power supply configured to output a second high frequency power;
a second high frequency transmission line configured to transmit the second high frequency power outputted from the second high frequency power supply to the first electrode or a second electrode provided within or in the vicinity of the processing vessel;
a second matching device, having a second variable reactance element and a second impedance sensor provided on the second high frequency transmission line, configured to control a reactance of the second variable reactance element such that a second load impedance measurement value outputted from the second impedance sensor is equal to or approximate to a second matching point corresponding to an output impedance of the second high frequency power supply; and
a second high frequency power modulation unit configured to pulse-modulate an output of the second high frequency power supply with a second pulse by alternately repeating a third period during which the second high frequency power is turned on or has a third level and a fourth period during which the second high frequency power is turned off or has a fourth level lower than the third level at a regular frequency lower than a frequency of the first pulse,
wherein the first impedance sensor calculates an average value of the load impedance by using a single cycle of the second pulse as a basic cycle, and outputs the first load impedance measurement value based on the average value of the load impedance, and
the second impedance sensor calculates an average value of the load impedance by using the single cycle of the second pulse as a basic cycle, and outputs the second load impedance measurement value based on the average value of the load impedance, and
wherein the second impedance sensor comprises:
a second cycle-average-value calculating circuit configured to sample voltage detection signals and electric current detection signals corresponding to the second high frequency power on the second high frequency transmission line with a preset sampling frequency during a second monitoring time set in either one of the first period and the second period in a single cycle of the second pulse and calculate an average value of the voltage detection signals and the electric current detection signals for the single cycle;
a second main-moving-average-value calculating circuit configured to calculate, by setting an $BN_2$ cycle of the second pulse as a moving range, a moving average value of multiple consecutive average values of the voltage detection signals for the single cycle of the second pulse and a moving average value of multiple consecutive average values of the electric current detection signals for the single cycle of the second pulse obtained from the second cycle-average-value calculating circuit; and
a second load impedance calculating circuit configured to calculate the second load impedance measurement value based on the moving average values of the voltage detection signals and the electric detection signals obtained from the second main-moving-average-value calculating circuit,
wherein the $BN_2$ is an integer equal to or larger than 2.

7. The plasma processing apparatus of claim 6,
wherein the second monitoring time is set in both of the third period and the fourth period within the single cycle of the second pulse.

8. The plasma processing apparatus of claim 6,
wherein if a duty ratio of the third period set by the second high frequency power modulation unit is equal to or higher than a second upper limit, the second monitoring time is set only in the third period in the single cycle of the second pulse,
if the duty ratio is equal to or lower than a second lower limit lower than the second upper limit, the second monitoring time is set only in the fourth period in the single cycle of the second pulse, and
if the duty ratio is between the second lower limit and the second upper limit, the second monitoring time is set in both of the third period and the fourth period in the single cycle of the second pulse.

9. A plasma processing apparatus of generating plasma by high frequency discharge of a processing gas between a first electrode and a second electrode provided to face each other within a decompression processing vessel that accommodates therein a processing target object, which is loaded into and unloaded from the processing vessel, and performing a process on the processing target object held on the first electrode under the plasma, the plasma processing apparatus comprising:

a first high frequency power supply configured to output a first high frequency power having a frequency suitable for plasma generation;

a first high frequency transmission line configured to transmit the first high frequency power outputted from the first high frequency power supply to either one of the first electrode and the second electrode;

a first matching device, having a first variable reactance element and a first impedance sensor provided on the first high frequency transmission line, configured to control a reactance of the first variable reactance element such that a first load impedance measurement value outputted from the first impedance sensor is equal to or approximate to a first matching point corresponding to an output impedance of the first high frequency power supply;

a first high frequency power modulation unit configured to pulse-modulate an output of the first high frequency power supply with a first pulse such that a first period during which the first high frequency power is turned on or has a first level and a second period during which the first high frequency power is turned off or has a second level lower than the first level are alternately repeated at a regular frequency;

a second high frequency power supply configured to output a second high frequency power having a frequency suitable for ion attraction into the processing target object held on the first electrode from the plasma;

a second high frequency transmission line configured to transmit the second high frequency power outputted from the second high frequency power supply to the first electrode;

a second matching device, having a second variable reactance element and a second impedance sensor provided on the second high frequency transmission line, configured to control a reactance of the second variable reactance element such that a second load impedance measurement value outputted from the second impedance sensor is equal to or approximate to a second matching point corresponding to an output impedance of the second high frequency power supply; and a second high frequency power modulation unit configured to pulse-modulate an output of the second high frequency power supply with a second pulse such that a third period during which the second high frequency power is turned on or has a third level and a fourth period during which the first high frequency power is turned off or has a fourth level lower than the third level are alternately repeated at a regular frequency different from a frequency of the first pulse, wherein if the frequency of the first pulse is higher than a frequency of the second pulse, the first impedance sensor calculates an average value of the load impedance by using a single cycle of the second pulse as a basic cycle and outputs the first load impedance measurement value based on the average value of the load impedance, and the second impedance sensor calculates an average value of the load impedance by using the single cycle of the second pulse as a basic cycle and outputs the second load impedance measurement value based on the average value of the load impedance, and if the frequency of the first pulse is lower than the frequency of the second pulse, the first impedance sensor calculates an average value of the load impedance by using a single cycle of the first pulse as a basic cycle and outputs the first load impedance measurement value based on the average value of the load impedance, and the second impedance sensor calculates an average value of the load impedance by using the single cycle of the first pulse as a basic cycle and outputs the second load impedance measurement value based on the average value of the load impedance, and wherein the first impedance sensor comprises:

a first cycle-average-value calculating circuit configured to sample voltage detection signals and electric current detection signals corresponding to the first high frequency power on the first high frequency transmission line with a preset sampling frequency during a first monitoring time set in either one of the first period and the second period in the single cycle of the first pulse and calculate an average value of the voltage detection signals and the electric current detection signals for the single cycle;

a preposition-moving-average-value calculating circuit configured to calculate, by setting the single cycle of the second pulse as a moving range, a primary moving average value of multiple consecutive average values of the voltage detection signals for the single cycle and multiple consecutive average values of the electric current detection signals for the single cycle obtained from the first cycle-average-value calculating circuit;

a first main-moving-average-value calculating circuit configured to calculate, by setting an $AN_2$ cycle of the second pulse as a moving range, a secondary moving average value of multiple consecutive primary average values of the voltage detection signals and a secondary moving average value of multiple consecutive primary average values of the electric current detection signals obtained from the preposition-moving-average-value calculating circuit; and a first load impedance calculating circuit configured to calculate the first load impedance measurement value based on the secondary moving average values of the voltage detection signals and the electric detection signals obtained from the first moving-average-value calculating circuit, wherein the $AN_2$ is an integer equal to or larger than 2.

* * * * *